United States Patent
Ninomiya

(12) United States Patent (10) Patent No.: US 7,884,818 B2
Ninomiya (45) Date of Patent: Feb. 8, 2011

(54) ARTICLE DESIGN SUPPORT SYSTEM AND METHOD OF CONTROLLING SAME

(76) Inventor: Kenichi Ninomiya, 6-14, Seijo 2-chome, Setagaya-ku, Tokyo 157-0066 (JP)

(*) Notice: Subject to any disclaimer, the term of this patent is extended or adjusted under 35 U.S.C. 154(b) by 910 days.

(21) Appl. No.: 11/792,819

(22) PCT Filed: Dec. 16, 2005

(86) PCT No.: PCT/JP2005/023549
§ 371 (c)(1), (2), (4) Date: Jun. 12, 2007

(87) PCT Pub. No.: WO2006/064971
PCT Pub. Date: Jun. 22, 2006

(65) Prior Publication Data
US 2007/0262982 A1 Nov. 15, 2007

(30) Foreign Application Priority Data
Dec. 17, 2004 (JP) .............................. 2004-366311

(51) Int. Cl.
*G06T 15/00* (2006.01)
(52) U.S. Cl. .................. 345/419; 345/420; 345/423; 345/157; 345/582; 345/630; 324/309; 382/118; 382/285; 700/97; 700/98; 700/145; 700/165; 700/182
(58) Field of Classification Search ............... 345/419, 345/423, 157, 420, 582, 630; 375/265; 324/309; 700/145, 165; 382/118, 285
See application file for complete search history.

(56) References Cited

U.S. PATENT DOCUMENTS

| 6,104,403 A | 8/2000 | Mukouchi et al. |
| 6,185,476 B1* | 2/2001 | Sakai .......................... 700/182 |
| 6,212,441 B1* | 4/2001 | Hazama et al. ............... 700/98 |
| 6,219,586 B1* | 4/2001 | Sakai .......................... 700/182 |
| 7,016,747 B1* | 3/2006 | Ninomiya .................... 700/97 |
| 7,069,093 B2* | 6/2006 | Thackston ................... 700/97 |
| 7,197,372 B2* | 3/2007 | Hazama ....................... 700/165 |
| 7,266,419 B2* | 9/2007 | Sakai et al. .................. 700/145 |

FOREIGN PATENT DOCUMENTS

| JP | 9-326046 | 12/1997 |
| JP | 11-144095 | 5/1999 |
| JP | 2002-41583 | 2/2002 |
| WO | WO 01/09778 A1 | 2/2001 |

* cited by examiner

*Primary Examiner*—Kimbinh T Nguyen
(74) *Attorney, Agent, or Firm*—McGinn IP Law Group, PLLC

(57) ABSTRACT

Provided is an article design support system featuring enhanced degree of freedom in terms of designing articles (for example, an article of furniture). A part space P surrounding a part incorporated in a cell space S is correlated with the cell space S, which is formed by a frame constituting a unit. The position (dimensions) of the part space P in the cell space S is defined by part space data specifying a relative position and relative dimensions using the cell space S as a reference. The position (dimensions) of a part in the part space P is defined by part (element) data specifying a relative position and relative dimensions using the part space P as a reference.

20 Claims, 32 Drawing Sheets

INSET DRAWER I

Fig. 13

CELL SPACE-PART SPACE LINKAGE DEFINITION DATA (CELL-SPACE PARTITIONING DEFINITION DATA) ⟵ 71

| DEFINITION | SURFACE POSITION | EXPLANATION |
|---|---|---|
| 0 | TOP SURFACE | |
| 1 | BOTTOM SURFACE | 0: LINKED TO ENLARGEMENT OR REDUCTION OF CELL SPACE (NO CELL PARTITIONING) |
| 0 | LEFT SURFACE | 1: NOT LINKED TO ENLARGEMENT OR REDUCTION OF CELL SPACE (CELL PARTITIONING) |
| 0 | RIGHT SURFACE | |
| 0 | FRONT SURFACE | |
| 0 | BACK SURFACE | |

PART-SPACE RELATIVE POSITION DEFINITION DATA ⟵ 72

| DEFINITION | SURFACE POSITION | EXPLANATION |
|---|---|---|
| 0 | TOP SURFACE | WHERE IS TOP SURFACE OF PART SPACE SITUATED RELATIVE TO TOP SURFACE OF CELL SPACE (PLUS IN OUTGOING DIRECTION) |
| 1000 | BOTTOM SURFACE | WHERE IS BOTTOM SURFACE OF PART SPACE SITUATED RELATIVE TO TOP SURFACE OF CELL SPACE (PLUS IN OUTGOING DIRECTION) |
| 0 | LEFT SURFACE | WHERE IS LEFT SURFACE OF PART SPACE SITUATED RELATIVE TO LEFT SURFACE OF CELL SPACE (PLUS IN OUTGOING DIRECTION) |
| 0 | RIGHT SURFACE | WHERE IS RIGHT SURFACE OF PART SPACE SITUATED RELATIVE TO RIGHT SURFACE OF CELL SPACE (PLUS IN OUTGOING DIRECTION) |
| 0 | FRONT SURFACE | WHERE IS FRONT SURFACE OF PART SPACE SITUATED RELATIVE TO FRONT SURFACE OF CELL SPACE (PLUS IN OUTGOING DIRECTION) |
| 0 | BACK SURFACE | WHERE IS BACK SURFACE OF PART SPACE SITUATED RELATIVE TO BACK SURFACE OF CELL SPACE (PLUS IN OUTGOING DIRECTION) |

ELEMENT DEFINITION DATA ⟵ 73

| DEFINITION | SURFACE POSITION | EXPLANATION |
|---|---|---|
| 0 | TOP SURFACE | |
| 1 | BOTTOM SURFACE | |
| 0 | LEFT SURFACE | 0: LINKED TO ENLARGEMENT OR REDUCTION OF PART SPACE |
| 0 | RIGHT SURFACE | 1: NOT LINKED TO ENLARGEMENT OR REDUCTION OF PART SPACE |
| 0 | FRONT SURFACE | |
| 0 | BACK SURFACE | |
| 50 | TOP SURFACE | WHERE IS TOP SURFACE OF ELEMENT SITUATED RELATIVE TO TOP SURFACE OF PART SPACE (PLUS VALUE IN INCOMING DIRECTION) |
| 100 | BOTTOM SURFACE | ELEMENT THICKNESS |
| 0 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 0 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 100 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 50 | BACK SURFACE | WHERE IS BACK SURFACE OF ELEMENT SITUATED RELATIVE TO BACK SURFACE OF PART SPACE (PLUS VALUE IN INCOMING DIRECTION) |

Fig. 14

CELL SPACE-PART SPACE LINKAGE DEFINITION DATA (CELL-SPACE PARTITIONING DEFINITION DATA) ⸺ 81

| DEFINITION | SURFACE POSITION | EXPLANATION |
|---|---|---|
| 0 | TOP SURFACE | 0: LINKED TO ENLARGEMENT OR REDUCTION OF CELL SPACE (NO CELL PARTITIONING)<br>1: NOT LINKED TO ENLARGEMENT OR REDUCTION OF CELL SPACE (CELL PARTITIONING) |
| 0 | BOTTOM SURFACE | |
| 0 | LEFT SURFACE | |
| 0 | RIGHT SURFACE | |
| 0 | FRONT SURFACE | |
| 1 | BACK SURFACE | |

PART-SPACE RELATIVE POSITION DEFINITION DATA ⸺ 82

| DEFINITION | SURFACE POSITION | EXPLANATION |
|---|---|---|
| −34 | TOP SURFACE | WHERE IS TOP SURFACE OF PART SPACE SITUATED RELATIVE TO TOP SURFACE OF CELL SPACE (PLUS IN OUTGOING DIRECTION) |
| −0.5 | BOTTOM SURFACE | WHERE IS BOTTOM SURFACE OF PART SPACE SITUATED RELATIVE TO BOTTOM SURFACE OF CELL SPACE (PLUS IN OUTGOING DIRECTION) |
| 0 | LEFT SURFACE | WHERE IS LEFT SURFACE OF PART SPACE SITUATED RELATIVE TO LEFT SURFACE OF CELL SPACE (PLUS IN OUTGOING DIRECTION) |
| 0 | RIGHT SURFACE | WHERE IS RIGHT SURFACE OF PART SPACE SITUATED RELATIVE TO RIGHT SURFACE OF CELL SPACE (PLUS IN OUTGOING DIRECTION) |
| −16 | FRONT SURFACE | WHERE IS FRONT SURFACE OF PART SPACE SITUATED RELATIVE TO FRONT SURFACE OF CELL SPACE (PLUS IN OUTGOING DIRECTION) |
| 0 | BACK SURFACE | WHERE IS BACK SURFACE OF PART SPACE SITUATED RELATIVE TO BACK SURFACE OF CELL SPACE (PLUS IN OUTGOING DIRECTION) |

ELEMENT DEFINITION DATA (FRONT BOARD) ⸺ 83A

| DEFINITION | SURFACE POSITION | EXPLANATION |
|---|---|---|
| 0 | TOP SURFACE | 0: LINKED TO ENLARGEMENT OR REDUCTION OF PART SPACE<br>1: NOT LINKED TO ENLARGEMENT OR REDUCTION OF PART SPACE |
| 0 | BOTTOM SURFACE | |
| 0 | LEFT SURFACE | |
| 0 | RIGHT SURFACE | |
| 0 | FRONT SURFACE | |
| 1 | BACK SURFACE | |
| 0 | TOP SURFACE | WHERE IS TOP SURFACE OF ELEMENT SITUATED RELATIVE TO TOP SURFACE OF PART SPACE (PLUS VALUE IN INCOMING DIRECTION) |
| 0 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 38 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 38 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 1 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 20 | BACK SURFACE | ELEMENT THICKNESS |

*Fig. 15*

ELEMENT DEFINITION DATA (INSIDE FRONT BOARD)  /83B

| DEFINITION | SURFACE POSITION | EXPLANATION |
|---|---|---|
| 0 | TOP SURFACE | 0:LINKED TO ENLARGEMENT OR REDUCTION OF PART SPACE<br>1:NOT LINKED TO ENLARGEMENT OR REDUCTION OF PART SPACE |
| 0 | BOTTOM SURFACE | |
| 0 | LEFT SURFACE | |
| 0 | RIGHT SURFACE | |
| 0 | FRONT SURFACE | |
| 1 | BACK SURFACE | |
| 15 | TOP SURFACE | WHERE IS TOP SURFACE OF ELEMENT SITUATED RELATIVE TO TOP SURFACE OF PART SPACE (PLUS VALUE IN INCOMING DIRECTION) |
| 9 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 60.5 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 60.5 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 21 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 13 | BACK SURFACE | ELEMENT THICKNESS |

ELEMENT DEFINITION DATA [SIDE PLANK (LEFT)]  /83C

| DEFINITION | SURFACE POSITION | EXPLANATION |
|---|---|---|
| 0 | TOP SURFACE | 0:LINKED TO ENLARGEMENT OR REDUCTION OF PART SPACE<br>1:NOT LINKED TO ENLARGEMENT OR REDUCTION OF PART SPACE |
| 0 | BOTTOM SURFACE | |
| 0 | LEFT SURFACE | |
| 1 | RIGHT SURFACE | |
| 0 | FRONT SURFACE | |
| 0 | BACK SURFACE | |
| 14 | TOP SURFACE | WHERE IS TOP SURFACE OF ELEMENT SITUATED RELATIVE TO TOP SURFACE OF PART SPACE (PLUS VALUE IN INCOMING DIRECTION) |
| 8 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 47.5 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 13 | RIGHT SURFACE | ELEMENT THICKNESS |
| 21 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 72 | BACK SURFACE | WHERE IS BACK SURFACE OF ELEMENT SITUATED RELATIVE TO BACK SURFACE OF PART SPACE (PLUS VALUE IN INCOMING DIRECTION) |

Fig. 16

ELEMENT DEFINITION DATA [SIDE PLANK (RIGHT)] ⟵ 83D

| DEFINITION | SURFACE POSITION | EXPLANATION |
|---|---|---|
| 0 | TOP SURFACE | 0: LINKED TO ENLARGEMENT OR REDUCTION OF PART SPACE<br>1: NOT LINKED TO ENLARGEMENT OR REDUCTION OF PART SPACE |
| 0 | BOTTOM SURFACE | |
| 1 | LEFT SURFACE | |
| 0 | RIGHT SURFACE | |
| 0 | FRONT SURFACE | |
| 0 | BACK SURFACE | |
| 14 | TOP SURFACE | WHERE IS TOP SURFACE OF ELEMENT SITUATED RELATIVE TO TOP SURFACE OF PART SPACE (PLUS VALUE IN INCOMING DIRECTION) |
| 8 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 13 | LEFT SURFACE | ELEMENT THICKNESS |
| 47.5 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 21 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 72 | BACK SURFACE | WHERE IS BACK SURFACE OF ELEMENT SITUATED RELATIVE TO BACK SURFACE OF PART SPACE (PLUS VALUE IN INCOMING DIRECTION) |

ELEMENT DEFINITION DATA (LEAD BOARD) ⟵ 83E

| DEFINITION | SURFACE POSITION | EXPLANATION |
|---|---|---|
| 0 | TOP SURFACE | 0: LINKED TO ENLARGEMENT OR REDUCTION OF PART SPACE<br>1: NOT LINKED TO ENLARGEMENT OR REDUCTION OF PART SPACE |
| 0 | BOTTOM SURFACE | |
| 0 | LEFT SURFACE | |
| 0 | RIGHT SURFACE | |
| 1 | FRONT SURFACE | |
| 0 | BACK SURFACE | |
| 15 | TOP SURFACE | WHERE IS TOP SURFACE OF ELEMENT SITUATED RELATIVE TO TOP SURFACE OF PART SPACE (PLUS VALUE IN INCOMING DIRECTION) |
| 9 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 60.5 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 60.5 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 13 | FRONT SURFACE | ELEMENT THICKNESS |
| 72 | BACK SURFACE | WHERE IS BACK SURFACE OF ELEMENT SITUATED RELATIVE TO BACK SURFACE OF PART SPACE (PLUS VALUE IN INCOMING DIRECTION) |

*Fig. 17*

ELEMENT DEFINITION DATA (BASE BOARD) ⎯ 83F

| DEFINITION | SURFACE POSITION | EXPLANATION |
|---|---|---|
| 1 | TOP SURFACE | 0:LINKED TO ENLARGEMENT OR REDUCTION OF PART SPACE<br>1:NOT LINKED TO ENLARGEMENT OR REDUCTION OF PART SPACE |
| 0 | BOTTOM SURFACE | |
| 0 | LEFT SURFACE | |
| 0 | RIGHT SURFACE | |
| 0 | FRONT SURFACE | |
| 0 | BACK SURFACE | |
| 4 | TOP SURFACE | ELEMENT THICKNESS |
| 19 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 55.5 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 55.5 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 29.5 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 80 | BACK SURFACE | WHERE IS BACK SURFACE OF ELEMENT SITUATED RELATIVE TO BACK SURFACE OF PART SPACE (PLUS VALUE IN INCOMING DIRECTION) |

ELEMENT DEFINITION DATA [SPACER (LEFT)] ⎯ 83G

| DEFINITION | SURFACE POSITION | EXPLANATION |
|---|---|---|
| 0 | TOP SURFACE | 0:LINKED TO ENLARGEMENT OR REDUCTION OF PART SPACE<br>1:NOT LINKED TO ENLARGEMENT OR REDUCTION OF PART SPACE |
| 0 | BOTTOM SURFACE | |
| 0 | LEFT SURFACE | |
| 1 | RIGHT SURFACE | |
| 0 | FRONT SURFACE | |
| 0 | BACK SURFACE | |
| 0 | TOP SURFACE | WHERE IS TOP SURFACE OF ELEMENT SITUATED RELATIVE TO TOP SURFACE OF PART SPACE (PLUS VALUE IN INCOMING DIRECTION) |
| 0 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 0 | LEFT SURFACE | WHERE IS LEFT SURFACE OF ELEMENT SITUATED RELATIVE TO LEFT SURFACE OF PART SPACE (PLUS VALUE IN INCOMING DIRECTION) |
| 35 | RIGHT SURFACE | ELEMENT THICKNESS |
| 0 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 0 | BACK SURFACE | WHERE IS BACK SURFACE OF ELEMENT SITUATED RELATIVE TO BACK SURFACE OF PART SPACE (PLUS VALUE IN INCOMING DIRECTION) |

*Fig. 18*

ELEMENT DEFINITION DATA [SPACER (RIGHT)]     83H

| DEFINITION | SURFACE POSITION | EXPLANATION |
|---|---|---|
| 0 | TOP SURFACE | 0:LINKED TO ENLARGEMENT OR REDUCTION OF PART SPACE<br>1:NOT LINKED TO ENLARGEMENT OR REDUCTION OF PART SPACE |
| 0 | BOTTOM SURFACE | |
| 1 | LEFT SURFACE | |
| 0 | RIGHT SURFACE | |
| 0 | FRONT SURFACE | |
| 0 | BACK SURFACE | |
| 0 | TOP SURFACE | WHERE IS TOP SURFACE OF ELEMENT SITUATED RELATIVE TO TOP SURFACE OF PART SPACE (PLUS VALUE IN INCOMING DIRECTION) |
| 0 | BOTTOM SURFACE | WHERE IS BOTTOM SURFACE OF ELEMENT SITUATED RELATIVE TO BOTTOM SURFACE OF PART SPACE (PLUS VALUE IN INCOMING DIRECTION) |
| 35 | LEFT SURFACE | ELEMENT THICKNESS |
| 0 | RIGHT SURFACE | WHERE IS RIGHT SURFACE OF ELEMENT SITUATED RELATIVE TO RIGHT SURFACE OF PART SPACE (PLUS VALUE IN INCOMING DIRECTION) |
| 0 | FRONT SURFACE | WHERE IS FRONT SURFACE OF ELEMENT SITUATED RELATIVE TO FRONT SURFACE OF PART SPACE (PLUS VALUE IN INCOMING DIRECTION) |
| 0 | BACK SURFACE | WHERE IS BACK SURFACE OF ELEMENT SITUATED RELATIVE TO BACK SURFACE OF PART SPACE (PLUS VALUE IN INCOMING DIRECTION) |

*Fig. 19*

ADDITIONAL-INFORMATION DEFINITION DATA
                                                                                 ⌐ 84

| DEFINITION | ADDITIONAL INFORMATION | EXPLANATION |
|---|---|---|
| 1 | SHELF BOARD NECESSARY OR NOT (ABOVE) | PROVIDE (1), OR DO NOT PROVIDE (0), SHELF BOARD ABOVE PART SPACE AUTOMATICALLY |
| 0 | SHELF BOARD NECESSARY OR NOT (BELOW) | PROVIDE (1), OR DO NOT PROVIDE (0), SHELF BOARD BELOW PART SPACE AUTOMATICALLY |
| 1 | OMIT SHELF BOARD (ABOVE) | OMIT (1), OR DO NOT OMIT (0) UPPER SHELF BOARD WHEN SHELF BOARDS ARE REDUNDANT |
| 0 | OMIT SHELF BOARD (BELOW) | OMIT (1), OR DO NOT OMIT (0) LOWER SHELF BOARD WHEN SHELF BOARDS ARE REDUNDANT |

Fig. 30

PART (ELEMENT) DETAIL-DRAWING RENDERING DEFINITION DATA

| RENDERING DEFINITION | SURFACE POSITION | VECTOR RENDERING | REFERENCE NO. |
|---|---|---|---|
| 1 | TOP SURFACE | 0 | — |
| 0 | BOTTOM SURFACE | — | — |
| 0 | LEFT SURFACE | — | — |
| 1 | RIGHT SURFACE | 1 | 11 |
| 1 | FRONT SURFACE | 0 | — |
| 0 | BACK SURFACE | — | — |

Fig. 31

| REFERENCE NO. | VECTOR DATA |
|---|---|
| ⋮ | ⋮ |
| 11 | DATA FOR HANGER PIPE (RIGHT SURFACE) |
| 12 | DATA FOR OUTSET DRAWER A (RIGHT SURFACE OF FRONT BOARD) |
| ⋮ | ⋮ |
| m | |
| ⋮ | ⋮ |

ARTICLE DESIGN SUPPORT SYSTEM AND METHOD OF CONTROLLING SAME

TECHNICAL FIELD

This invention relates to a system for supporting design of an article, one example of which is an article of furniture, and to a method of controlling this system.

BACKGROUND ART

A support tool (a furniture design support system) for designing an article (e.g., furniture) involving several factors such as shape, structure, dimensions, color, materials and quality of material in line with the wishes of the user is disclosed in WO 01/09778 (referred to as the "patent document" below).

According to the furniture design support system described in the patent document, parts (drawers, doors, legs, handles, etc.) are incorporated in a unit, which is a basic frame. Each part is correlated with a space (cell) defined in the unit. That is, the unit has a space (a cell) defined by a top board, bottom board, left side board, right side board and back board that construct the unit, and a part such as a drawer is incorporated in correlation with the cell. The cell can be partitioned by combining a partitioning board with the cell defined by the unit, and a part can be incorporated in each of the cells obtained by partitioning.

In accordance with the furniture design support system described in the patent document, not only an article of furniture constituted simply by a frame alone but also an article of furniture having a complicated structure in which various parts such as drawers are incorporated in spaces (cells) defined by the unit can be designed by combining parts in association with cells defined by the unit and partitioning boards.

The furniture design support system described in the patent document incorporates one part in one cell. A plurality of parts cannot be incorporated in one cell. Consequently, in a case where a plurality of parts are to be incorporated according to the furniture design support system described in the patent document, it is necessary that a plurality of cells be formed in advance by partitioning boards.

Further, in a case where a change is to be made to the dimensions of an article of furniture whose design has been completed or to the dimensions of an article of furniture that is in the process of being completed, the be partitioned by combining a partitioning board with the cell defined by the unit, and a part can be incorporated in each of the cells obtaining by partitioning.

In accordance with the furniture design support system described in the patent document, not only an article of furniture constituted simply by a frame alone but also an article of furniture having a complicated structure in which various parts such as drawers are incorporated in spaces (cells) defined by the unit can be designed by combining parts in association with cells defined by the unit and partitioning boards.

The furniture design support system described in the patent document incorporates one part in one cell. A plurality of parts cannot be incorporated in one cell. Consequently, in a case where a plurality of parts are to be incorporated according to the furniture design support system described in the patent document, it is necessary that a plurality of cells be formed in advance by partitioning boards.

Further, in a case where a change is to be made to the dimensions of an article of furniture whose design has been completed or to the dimensions of an article of furniture that is in the process of being completed, the furniture design support system described in the patent document is such that the dimensions of a part that has been incorporated in a unit (cell) cannot readily be changed in accordance with the change in dimensions of the unit (cell). The reason is that according to the system described in the patent document, all parts that have been incorporated in the unit have their dimensions (height, width and depth) decided using the coordinates (x, y, z) of the front lower left-hand corner of the cell as a reference.

DISCLOSURE OF THE INVENTION

An object of the present invention is to provide an article design support system that enhances the degree of freedom with which an article (e.g., an article of furniture) is designed.

Another object of the present invention is to so arrange it that the dimensions of a part can readily be changed by following up a change in dimensions of a unit in a state in which a part has been incorporated in the unit.

An article design support system according to the present invention is a system for displaying images representing basic structural members (units) of a plurality of types and images representing parts of a plurality of types on a display device, and combining a basic structural member selected from among the displayed structural members of the plurality of types and a part selected from among the displayed parts of the plurality of types, thereby displaying (designing) an article constructed by combining the basic structural member and the part. The article design support system is a system having a computer, an input device, a display device and a memory, etc., and designs an article using a computer system. The article design support system can be used to design furniture, by way of example.

Fundamentally, the article design support system combines a part, which has been selected using the input device, with a basic structural member (unit) that has been selected using the input device, thereby designing an article that is composed of the basic structural member and part. The basic structural member signifies a member that constitutes the frame of the article. In terms of an article of furniture, a part, e.g., a drawer, a shelf board or a hanger pipe, can be combined with the frame that is the basic structural member, and articles of furniture having various shapes or structures can be designed depending upon the types of part combined and the placement positions (incorporated positions) of the parts.

The article design support system according to the present invention comprises: first storage means for storing, with regard to each part of the plurality of types, three-dimensional part space data specifying relative position and relative dimensions using as a reference a three-dimensional cell space defined by the basic structural member; second storage means for storing, with regard to each part of the plurality of types, three-dimensional part data specifying relative position and relative dimensions using as a reference a three-dimensional part space defined by the three-dimensional part space data; cell space/part space correlating means for correlating, on a one-to-one basis, a three-dimensional cell space defined by a selected basic structural member and a three-dimensional part space regarding a selected part; and display control means for displaying a part image in a three-dimensional cell space with which a three-dimensional part space has been correlated by the cell space/part space correlating means, the part image being displayed at a position decided by three-dimensional part space data, which concerns a selected part, stored in the first storage means, and three-dimensional part data, which concerns the selected part, stored in the second storage means, the part image having dimensions decided by the three-dimensional part space data and the three-dimensional part data. Of course, the image of an article that includes the part image displayed by the display control means can be printed out from a printer.

A method of controlling an article design support system according to the present invention is a method of controlling an article design support system for displaying images representing basic structural members of a plurality of types and images representing parts of a plurality of types on a display device, and combining a basic structural member selected from among the displayed structural members of the plurality of types and a part selected from among the displayed parts of the plurality of types, thereby displaying an article constructed by combining the basic structural member and the part, the method comprising the steps of: storing in first storage means, with regard to each part of the plurality of types, three-dimensional part space data specifying relative position and relative dimensions using as a reference a three-dimensional cell space defined by the basic structural member; storing in second storage means, with regard to each part of the plurality of types, three-dimensional part data specifying relative position and relative dimensions using as a reference a three-dimensional part space defined by the three-dimensional part space data; correlating, by cell space/part space correlating means, on a one-to-one basis, a three-dimensional cell space defined by a selected basic structural member and a three-dimensional part space regarding a selected part; and displaying, by display control means, a part image in the three-dimensional cell space with which the three-dimensional part space has been correlated, the part image being displayed at a position decided by three-dimensional part space data, which concerns a selected part, stored in the first storage means, and three-dimensional part data, which concerns the selected part, stored in the second storage means, the part image having dimensions decided by the three-dimensional part space data and the three-dimensional part data.

The article design support system according to the present invention utilizes the concept of two types of space, namely three-dimensional cell space and three-dimensional part space.

Three-dimensional cell space refers to three-dimensional space having dimensions (height, width and depth) decided by a basic structural member. Three-dimensional cell space is space having the shape of a rectangular parallelepiped. The space has six surfaces, namely a top surface, bottom surface, left surface, right surface, front surface and back surface. The region surrounded by these six surfaces is the three-dimensional cell space.

Three-dimensional part space refers to space having the shape of a rectangular parallelepiped surrounding a part incorporated in a three-dimensional cell space defined by a basic structural member. Each of a plurality of types of part has a three-dimensional part space. The first storage means (a hard disk, etc.) stores three-dimensional part space data regarding each part of the plurality of types.

Three-dimensional part space has its position and dimensions (height, width and depth) defined by data (three-dimensional part space data) specifying relative position and dimensions using the above-mentioned three-dimensional cell space as a reference.

In an embodiment, the three-dimensional part space data defines the positions of a top surface, bottom surface, left surface, right surface, front surface and back surface of the three-dimensional part space by data representing distances from corresponding surfaces of the three-dimensional cell space. That is, the positions of the top surface, bottom surface, left surface, right surface, front surface and back surface of the three-dimensional part space are determined by distances using the top surface, bottom surface, left surface, right surface, front surface and back surface of the three-dimensional cell space as a reference.

At least one position among the positions of respective ones of the top surface, bottom surface, left surface, right surface, front surface and back surface of the three-dimensional part space may be defined by data representing distance from the opposite surface of the three-dimensional cell space. By way of example, the opposite surface of the three-dimensional cell space signifies the bottom surface of the three-dimensional cell space with regard to the top surface of the three-dimensional part space, and signifies the top surface of the three-dimensional cell space with regard to the bottom surface of the three-dimensional part space. By way of example, the position of the bottom surface of the three-dimensional part space is defined by data representing distance from the top surface of the three-dimensional cell space, and the remaining surfaces (top surface, left surface, right surface, front surface and back surface) of the three-dimensional part space are defined by distances from the corresponding surfaces of the three-dimensional cell space.

Data (three-dimensional part data) specifying relative position and dimensions using the three-dimensional part space as a reference is stored in the second storage means with regard to each of the plurality of types of parts. That is, each part of the plurality of types has three-dimensional part space data that uses the three-dimensional cell space as a reference, and three-dimensional part data that uses the three-dimensional part space as a reference.

The parts are classified broadly into a first part formed by a single minimal structural element, and a second part formed by combining a plurality of minimal structural elements. The second storage means stores, with regard to each of the plurality of minimal structural elements concerning the second part, three-dimensional minimal structural element data specifying relative position and relative dimensions using as a reference the three-dimensional part space defined by the three-dimensional part space data. Parts having various structures can be defined by defining a data structure in such a manner that three-dimensional minimal structural element data is stored with regard to each of the plurality of minimal structural elements constructing a part, using the three-dimensional part space as a reference.

In an embodiment, the three-dimensional part data or the three-dimensional minimal structural element data are respective ones of items of data representing distances from the top surface, bottom surface, left surface, right surface, front surface and back surface of the three-dimensional part space. It may be so arranged that the three-dimensional part data or the three-dimensional minimal structural element data is defined by data representing distances from any five surfaces among the top surface, bottom surface, left surface, right surface, front surface and back surface of the three-dimensional part space, and data representing the thickness of the part or minimal structural element.

In accordance with the present invention, three-dimensional part space regarding a selected part is correlated with three-dimensional cell space defined by a basic structural member. Three-dimensional part space has its position and dimensions decided by three-dimensional part space data specifying relative position and relative dimensions using three-dimensional cell space as a reference. Furthermore, since three-dimensional part data specifying relative position and relative dimension using as a reference the three-dimensional part space defined by the three-dimensional part space data has been defined for a part, a part that is combined with a basic structural member becomes correlated with three-dimensional cell space via the three-dimensional part space.

Three-dimensional part space has a relative position and dimensions the reference of which is the three-dimensional cell space. In a case where the three-dimensional cell space (basic structural member) is enlarged or reduced, therefore, the three-dimensional part space that has been correlated with the three-dimensional cell space is enlarged or reduced in accordance with the enlargement or reduction of the three-dimensional cell space. Furthermore, since a part has a relative position and dimensions the reference of which is the three-dimensional part space, the part or minimal structural element is moved to an appropriate location and the dimensions thereof are enlarged or reduced in accordance with an enlargement of reduction of the three-dimensional part space.

Thus, according to the present invention, in accordance with an enlargement or reduction of three-dimensional cell space, the three-dimensional part space and part (or minimal structural element) correlated with this three-dimensional cell space are enlarged or reduced. In accordance with the dimensions of an article (e.g., an article of furniture) to be designed, it is unnecessary to prepare a plurality of items of data having different dimensions in regard to a part of the same type. Further, in a case where three-dimensional cell space has been enlarged or reduced, the dimensions of the part that has been incorporated in this three-dimensional cell space (the dimensions of the three-dimensional part space) need not be separately enlarged or reduced in accordance with the enlargement or reduction of the three-dimensional cell space (i.e., a repetitive enlarging or reducing operation need not be performed). This facilitates design. Furthermore, it is possible to support an enlargement or reduction in any of six directions (upward direction, downward direction, leftward direction, rightward direction, forward direction and rearward direction).

Preferably, third storage means is provided for storing data specifying, on a per-surface basis with regard to each part of the plurality of types, whether the top surface, bottom surface, left surface, right surface, front surface and back surface of the three-dimensional cell space and respective corresponding surfaces of the three-dimensional part space are linked. Whether the positions of the six surfaces of the three-dimensional part space relative to the corresponding six surfaces of the three-dimensional cell space are to be maintained at all times (i.e., whether linkage is to be turned on or off) is defined. For example, with regard to a certain part, assume the fact that among the six surfaces, namely the top surface, bottom surface, left surface, right surface, front surface and back surface of the three-dimensional part space of the part, five surfaces, namely the top surface, left surface, right surface, front surface and back surface, are linked to the corresponding surfaces of the three-dimensional cell space, and that the bottom surface is not linked has been stored in the third storage means. If, when such a part (three-dimensional part space) is incorporated in the three-dimensional cell space, the three-dimensional cell space is enlarged or reduced, then, with regard to the five surfaces, namely the top surface, left surface, right surface, front surface and back surface, of the three-dimensional part space concerning this part, enlargement or reduction takes place attendant upon the enlargement or reduction of the three-dimensional cell space (this is in conformance with the relative position defined by the three-dimensional part space data that has been stored in the first storage means).

In the above-mentioned case, it would suffice when the position of the bottom surface of the three-dimensional part space, for example, is defined by the distance from the top surface of the three-dimensional cell space.

Preferably, cell space partitioning means is provided for partitioning the three-dimensional cell space in a case where the size of the three-dimensional cell space correlated by the cell space/part space correlating means is larger than that of the three-dimensional part space. One three-dimensional cell space defined by a basic structural member is partitioned into two three-dimensional cell spaces. Since a three-dimensional cell space and three-dimensional part space are in one-to-one correspondence, a three-dimensional cell space with which a three-dimensional part space has been correlated and a three-dimensional cell space with which a three-dimensional part space has not been correlated are produced by cell space partitioning. Another part (three-dimensional part space) can be further correlated with a three-dimensional cell space with which a three-dimensional part space has not been correlated.

It may be so arranged that even in a case where a three-dimensional cell space larger than a three-dimensional part space has been defined by enlarging a three-dimensional cell space with which a three-dimensional part space has been correlated, this three-dimensional cell space may be partitioned.

The system may further comprise fourth storage means for storing data specifying, on a per-surface basis with regard to each part of the plurality of types, whether the top surface, bottom surface, left surface, right surface, front surface and back surface of the three-dimensional part space and a respective corresponding surface of the part or minimal structural element constituting the part are linked. For every part or for every one of the plurality of minimal structural elements constituting the part, whether the top surface, bottom surface, left surface, right surface, front surface and back surface thereof are enlarged or reduced in linkage with the top surface, bottom surface, left surface, right surface, front surface and back surface of the three-dimensional part space is defined.

In a preferred embodiment, the system further comprises detail drawing creating means for creating a detail drawing that includes dimensions regarding a basic structural member included in an article, a part included in an article and at least one of the minimal structural elements constituting a part included in an article, based upon the three-dimensional cell space, the three-dimensional part space data and the three-dimensional part data; and output means for outputting the detail drawing that includes the dimensions created by the detail drawing creating means. Since dimensions (positions of six surfaces) of a basic structural member, part and minimum structural element are defined by the three-dimensional cell space, three-dimensional part space data and three-dimensional part data, a detail drawing (plan view, front view, etc., represented by a rectangular shape) can be created and output (in the form of a display output or printout) with regard to these.

Vector rendering data storage means storing vector rendering data is provided in advance in a case where a drawing other than one having a rectangular shape is rendered. In this case, on the basis of vector rendering data that has been stored in the vector rendering data storage means, the detail drawing creating means renders a detail drawing regarding a predetermined surface in a previously defined basic structural member, part or minimal structural element. A drawing (e.g. a circle shape) other than one having a rectangular shape can be rendered.

The present invention further provides a program for accepting input of data stored in the first to fourth storage means described above and storing the data in first to fourth storage means.

BRIEF DESCRIPTION OF THE DRAWINGS

FIG. 13 illustrates definition data regarding a hanger pipe;

FIG. 14 illustrates definition data regarding an inset drawer;

FIG. 15 illustrates definition data regarding an inset drawer;

FIG. 16 illustrates definition data regarding an inset drawer;

FIG. 17 illustrates definition data regarding an inset drawer;

FIG. 18 illustrates definition data regarding an inset drawer;

FIG. 19 illustrates definition data regarding an inset drawer;

FIG. 30 illustrates detail-drawing rendering definition data regarding a hanger pipe;

FIG. 31 illustrates a vector data table;

BEST MODE FOR CARRYING OUT THE INVENTION

1. Hardware Configuration

Figure 1:
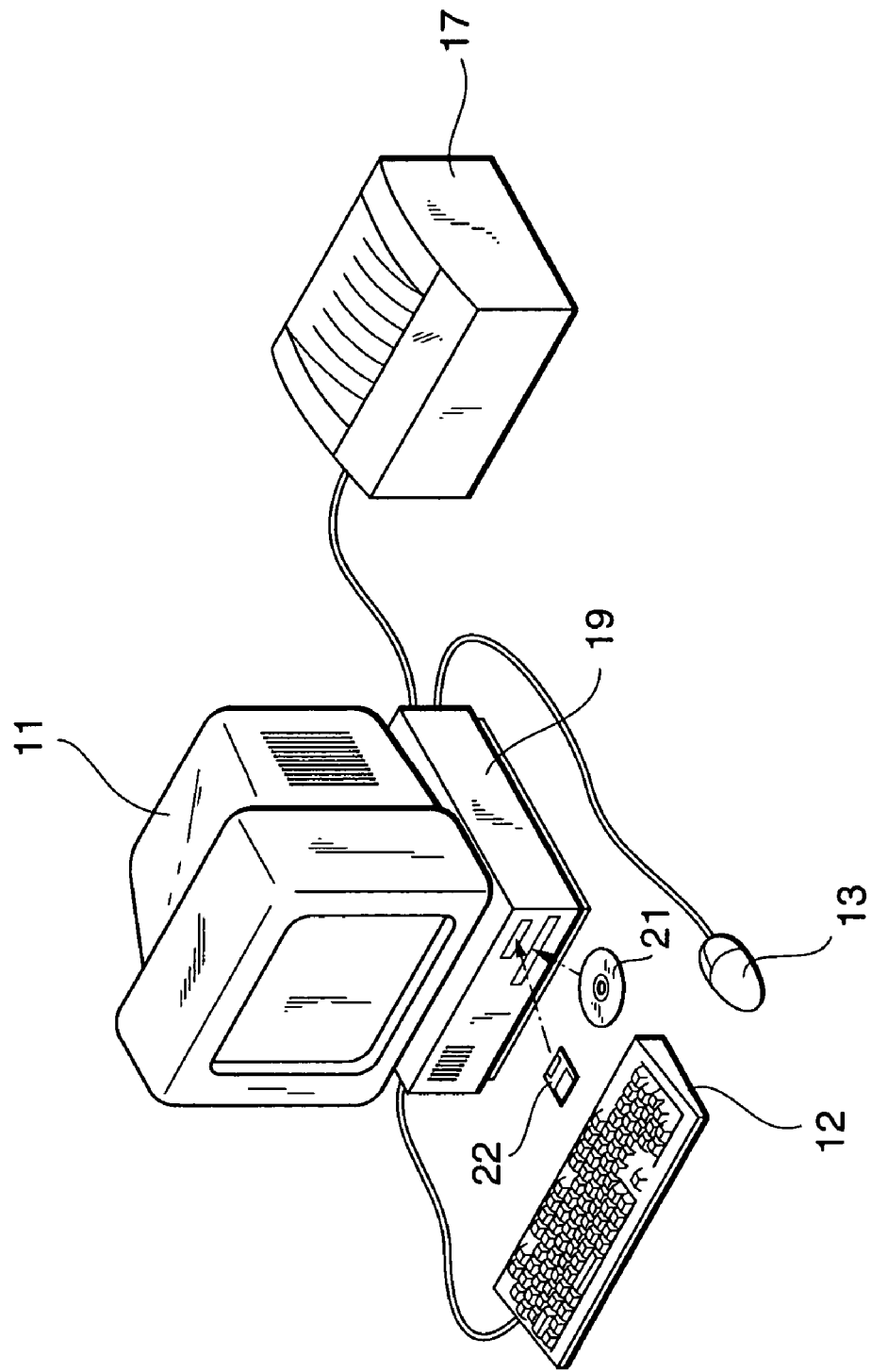
FIG. 1 is a perspective view illustrating the external appearance of a furniture design support apparatus.
Figure 2:
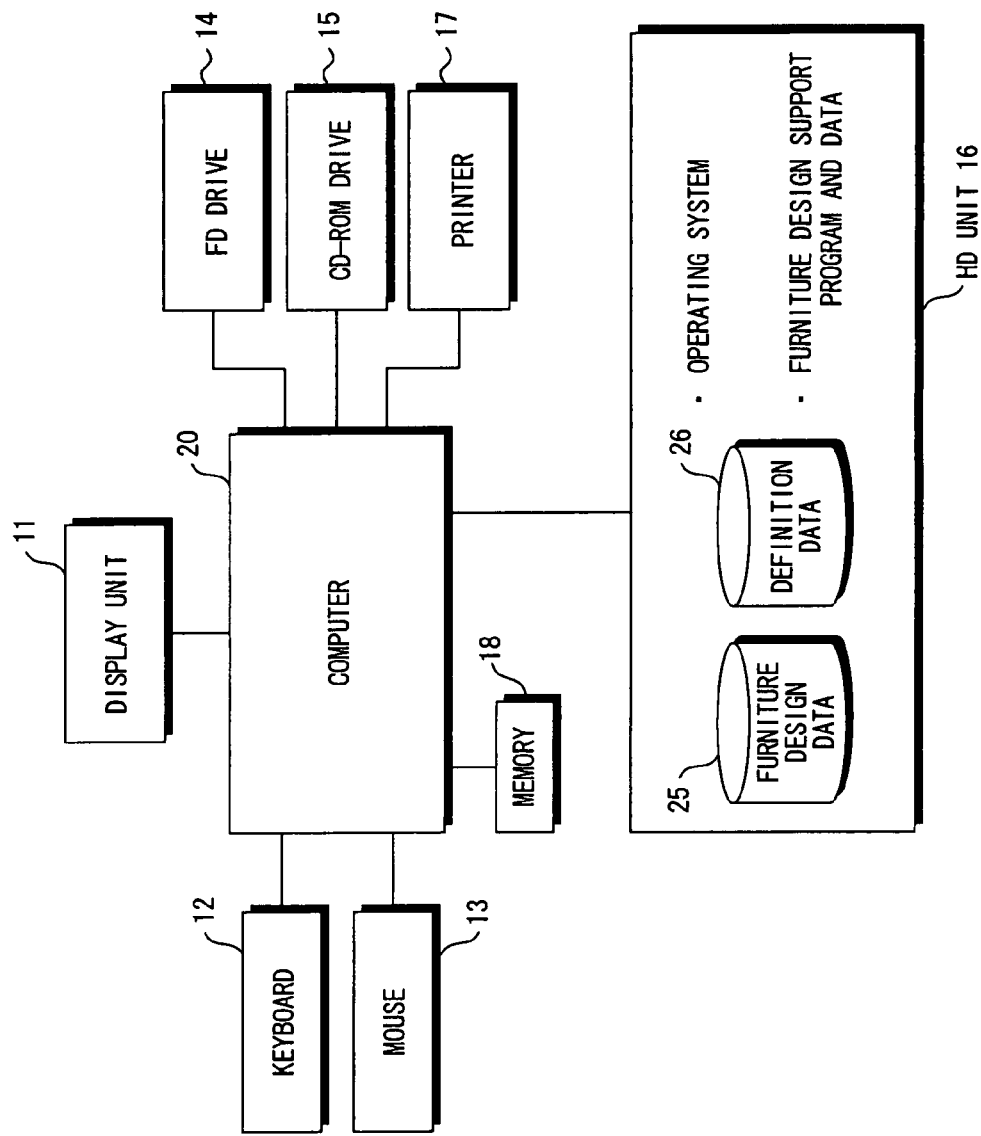
FIG. 2 is a block diagram illustrating the electrical structure of the furniture design support apparatus.

FIG. 1 illustrates the external appearance of a furniture design support apparatus. FIG. 2 is a block diagram illustrating the electrical structure of the furniture design support apparatus.

The furniture design support apparatus is constructed by a computer system (e.g., a personal computer) that includes a computer 20. An FD drive 14, CD-ROM drive 15, hard-disk unit (HD unit) 16 and a memory 18 are connected to the computer 20, and these are housed in a computer case 19. The FD drive 14 writes data to a flexible disk (FD) 22 and reads data from the FD 22. The CD-ROM drive 15 reads data from a CD-ROM 21. The HD unit 16 reads an operating system, furniture design support program and data that have been stored on a hard disk. The computer system functions as a furniture design support apparatus based upon the program and data read from the hard disk.

Various windows are displayed on the display screen of a display unit 11 based upon display data supplied from the computer 20. The operator uses a keyboard 12 and mouse 13 to click (select) and input numerical values, etc. Result of processing, etc., displayed on the display screen of the display unit 11 can be printed from a printer 17.

The hard disk of the HD unit 16 is provided with a furniture design database 25 on which furniture design data is stored. The image of an article of furniture that has been designed using the furniture design support apparatus based upon the furniture design data and a design diagram, etc., are displayed on the display screen of the display unit 11 and printed out from the printer 17. Further, the hard disk of the HD unit 16 is provided with a definition database 26 in which definition data has been stored. Definition data regarding each of a plurality of units and parts, described later, has been stored in the definition database 26. The details of the definition data will be described later.

2. Units and Parts

Figure 3:
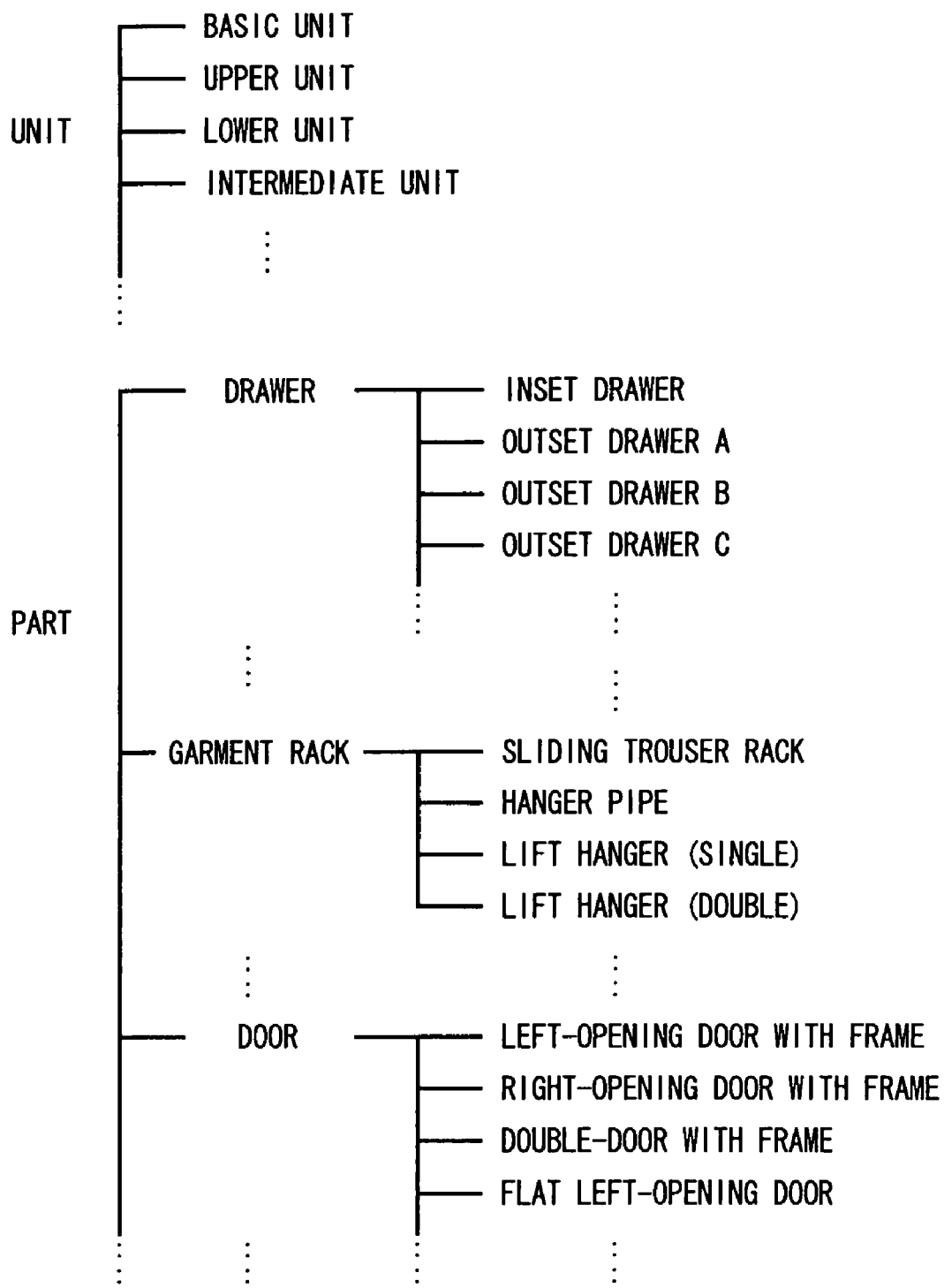
FIG. 3 illustrates structural members that construct an article of furniture.

FIG. 3 illustrates some structural members that construct an article of furniture designed by the furniture design support apparatus.

In the furniture design support apparatus, an article of furniture is created (designed) by combining structural members of a plurality of types. Structural members are classified broadly into units and parts.

A unit refers to a frame, which is the most fundamental constituent of the structure of an article of furniture. A unit basically has a structure constituted by a top board, bottom board, left-side board, right-side board and back board, with the front being left open.

A space exists in the interior of the top board, bottom board, left-side board, right-side board and back board (the interior of the frame) that construct the unit. In this specification, the space within the unit shall be referred to as "cell space". The cell space is partitioned into smaller spaces by parts (e.g., shelves, drawers, etc.). A small space formed by such partitioning also shall be referred to as a "cell space" in this specification. A cell space is a three-dimensional space having the shape of a rectangular parallelepiped.

With this furniture design support apparatus, a single article of furniture can be created by combining units of a plurality of types. Units of a plurality of types that take combinations of units into account are defined in advance. In this embodiment, units are classified into a basic unit, an upper unit, a lower unit, an intermediate unit, etc. The basic unit is the most general unit and is composed of a top board, bottom board, left-side board, right-side board and back board. The upper unit is a unit superimposed on the upper portion of the basic unit. It is composed of a top board, left-side board, right-side board and back board and does not have a bottom board. The top board of the basic unit serves also as the bottom board of the upper unit. The lower unit is a unit superimposed on the lower portion of the basic unit. It is composed of a bottom board, left-side board, right-side board and back board and does not have a top board. The intermediate unit is a unit placed between basic units situated side by side, by way of example. It is composed of a top board, bottom board and back board and does not have a right-side board and a left-side board.

A part refers to a structural member other than a unit among the structural members that construct an article of furniture. Parts are classified into drawers, garment racks and doors, etc. (This constitutes a major class.) Drawers are classified into an inset drawer, outset drawer A, outset drawer B and outset drawer C, etc. (This constitutes a minor class. A garment rack is classified into a sliding trouser rack, hanger pipe, lift hanger (single) and lift hanger (double), etc. Doors are classified into a left-opening door with frame, right-opening door with frame, double-door with frame and flat left-opening door, etc.

A cell space is defined for a unit, as mentioned above. A part space surrounding a part is defined for a part belonging to the minor class of parts, as will be evident from the description that follows. The part space also is a three-dimensional space having the shape of a rectangular parallelepiped. The details of the part space will be described later.

Besides the above-mentioned units and parts, auxiliary structural members (wheels, handles, etc.) may also be prepared as structural members.

Figure 4:
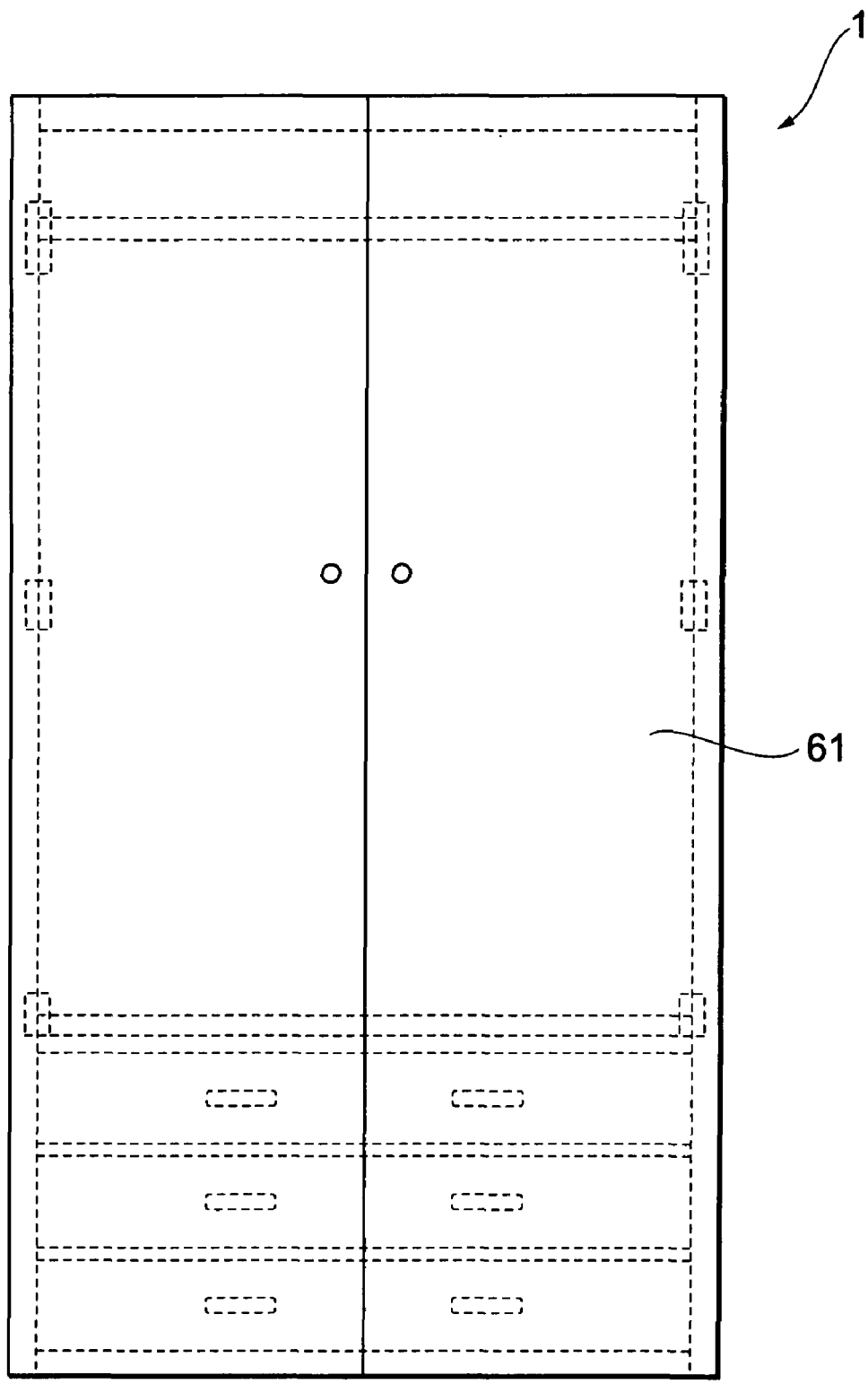
FIG. 4 illustrates the external appearance of a completed article of furniture.
Figure 5:
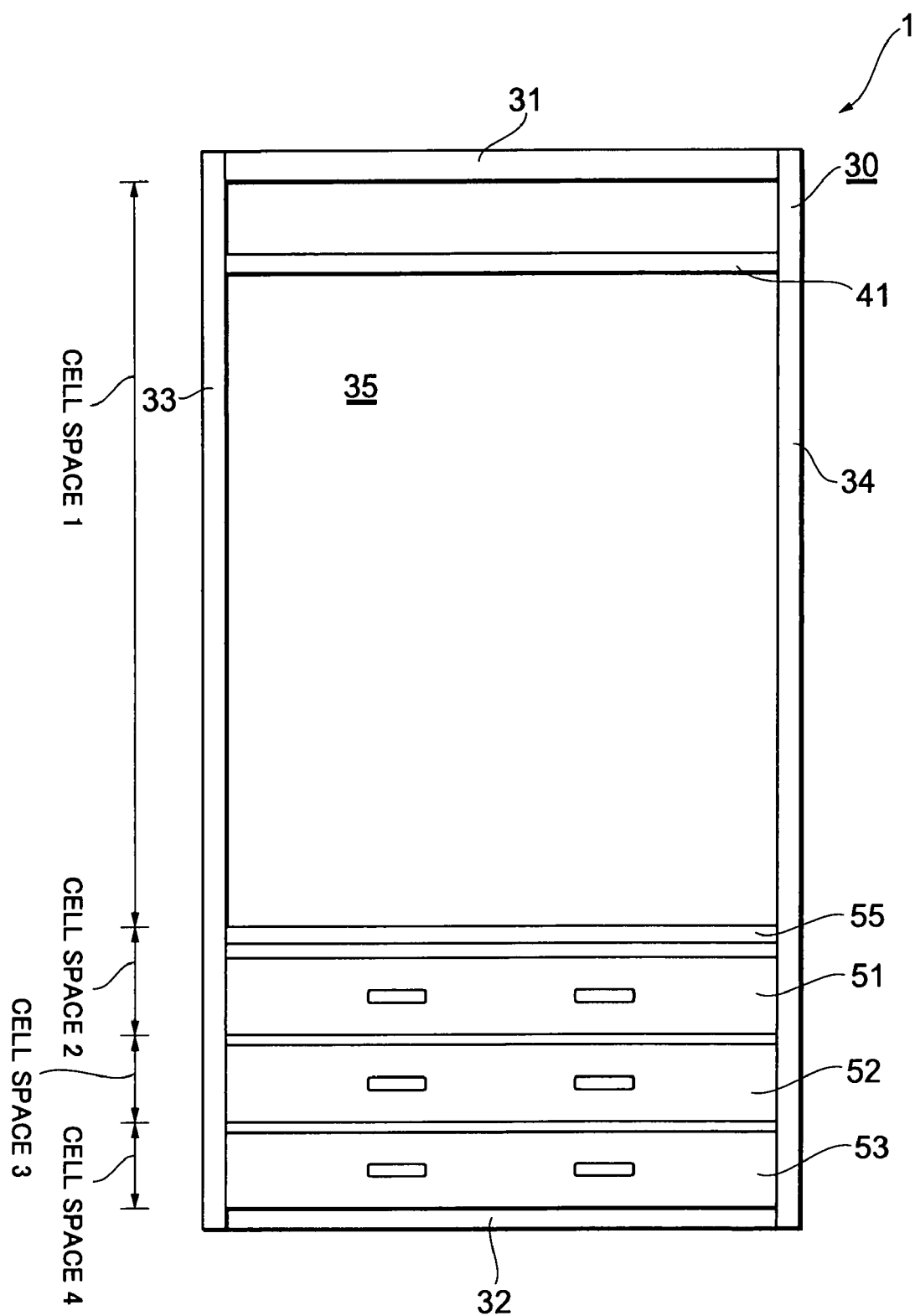
FIG. 5 illustrates the external appearance of a completed article of furniture.

FIGS. 4 and 5 are front views illustrating an example of an article of furniture that has been designed by combining units and parts. FIG. 5 illustrates a state in which a double door 61 provided on an article of furniture 1 shown in FIG. 5 has been removed.

The article of furniture 1 shown in FIGS. 4 and 5 is composed of a single unit 30, which is constituted by a top board 31, bottom board 32, left side board 33, right side board 34 and back board 35, and six parts, namely a hanger pipe 41, three inset drawers 51, 52, 53, a shelf board 55 forming the top surface of the uppermost inset drawer 51, and a double door 61.

The article of furniture illustrated in FIGS. 4 and 5 includes four cell spaces. As mentioned above, a cell space inside a top board, bottom board, right side board, left side board and back board constituting a unit is partitioned by parts placed in the cell space. The cell space defined by the unit 30 is partitioned into four cell spaces (cell space 1, cell space 2, cell space 3 and cell space 4) by the hanger pipe 41 and three inset drawers 51, 52, 53. In this embodiment, the double door 61 is treated as an accessory and is not a part that partitions the cell space (The double door 61 is not a part having a part space).

3. Cell Spaces and Part Spaces

Figure 6:
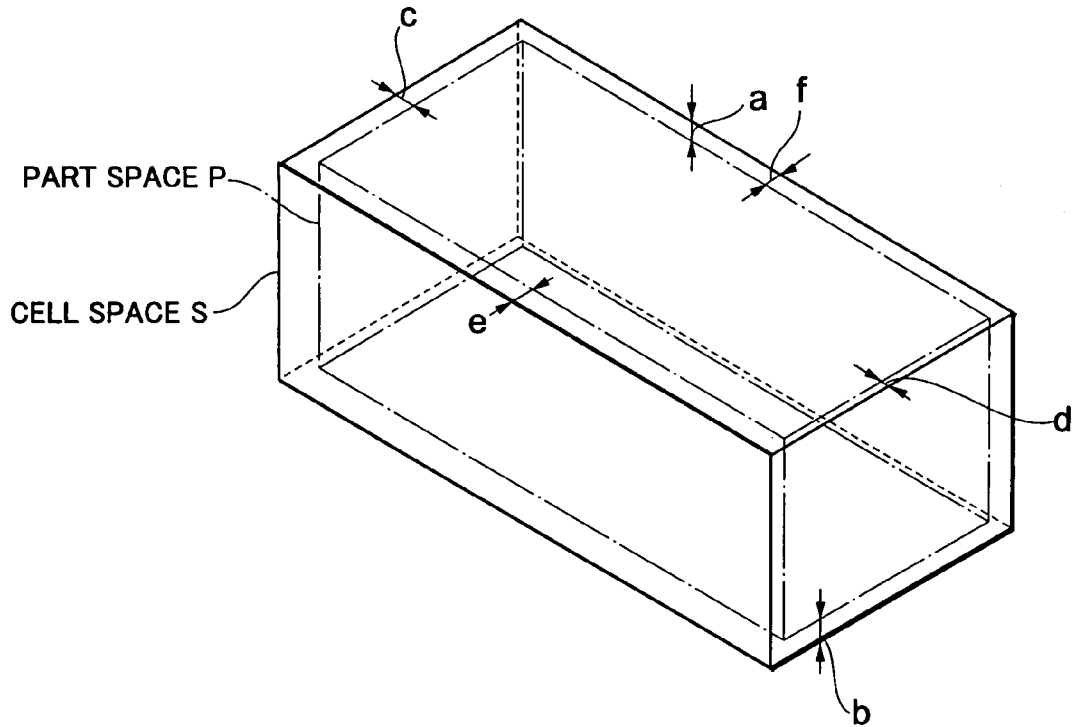
FIG. 6 illustrates the relationship between cell space and part space.
Figure 7:
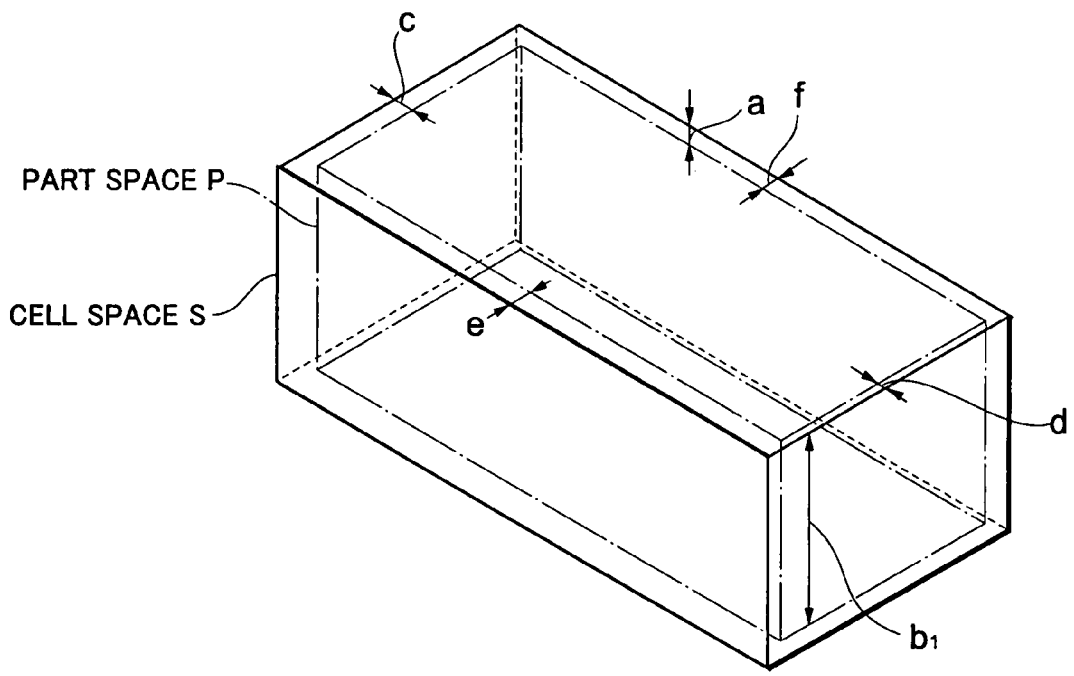
FIG. 7 illustrates the relationship between cell space and part space.

FIGS. 6 and 7 illustrate the positional relationship between a cell space S and a part space P. In FIGS. 6 and 7, the cell space S is illustrated by the solid lines and the part space P by the one-dot chain lines.

With this furniture design support apparatus, the cell space S is defined for a unit, and the part space P exists for a part, as described above.

The part space P has its position and dimensions defined relatively using the cell space S as a reference. The cell space S and the part space P both have the shape of a rectangular parallelepiped.

As shown in FIG. 6, the positions of the six surfaces of the part space P, namely the top surface, bottom surface, left surface, right surface, front surface and back surface thereof, can be defined using as a reference the six surfaces of the cell space S, namely the top surface, bottom surface, left surface, right surface, front surface and back surface thereof, respectively. More specifically, the position of the top surface of the part space P and the position of the bottom surface of the part space P are defined by distance a from the top surface of the cell space S and a distance b from the bottom surface of the cell space S, respectively. Similarly, the positions of the left surface, right surface, front surface and back surface of the part space P are defined by distance c from the left surface of cell space S, distance d from the right surface of cell space S, distance e from the front surface of cell space S and distance f from the back surface of cell space S, respectively. The relative positional relationship (relative size relationship) between the cell space S and the part space P is specified beforehand on a per-part basis.

Among the six surfaces of the part space P, namely the top surface, bottom surface, left surface, right surface, front surface and back surface thereof, one or a plurality of surfaces can be defined by the distances from the opposite surfaces of the cell space S (e.g., from the top surface of cell space S to the bottom surface of part space P) instead of the distances from the corresponding surfaces of cell space S).

As shown in FIG. 7, the positions of the top surface, left surface, right surface, front surface and back surface of the part space P are defined by the respective distances from the corresponding top surface, left surface, right surface, front surface and back surface of the cell space S in a manner similar to that illustrated in FIG. 6. The position of the bottom surface of part space P is defined by distance b1 from the surface (top surface) of cell space S that is opposite the bottom surface of part space P.

The part space P has its position and dimensions thus defined by a relative positional relationship that uses the cell space S as a reference. If processing for combining a part with a unit is executed in this furniture design support apparatus, the part space P regarding the combined part is correlated with the cell space S defined for the unit. At such time the positions of the top surface, bottom surface, left surface, right surface, front surface and back surface of the part space P of the combined part are decided by the relative positional relationship that uses the cell space S as the reference. The dimensions of the part space P are also decided by deciding the positions of the top surface, bottom surface, left surface, right surface, front surface and back surface of the part space P. The cell space S and part space P are in one-to-one correspondence.

Figure 8:
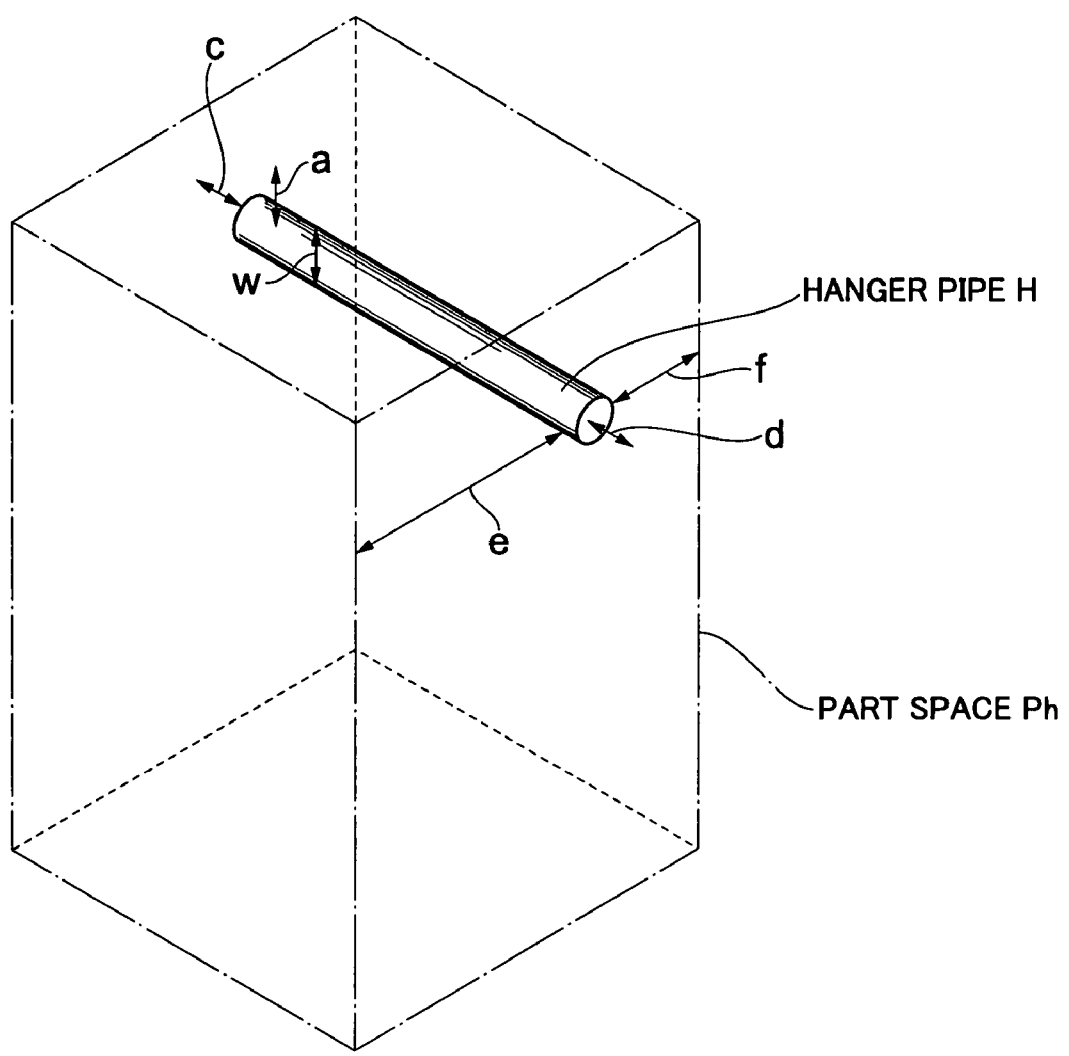
FIG. 8 illustrates the relationship between part space regarding a hanger pipe and position of the hanger pipe in the part space.
Figure 9:
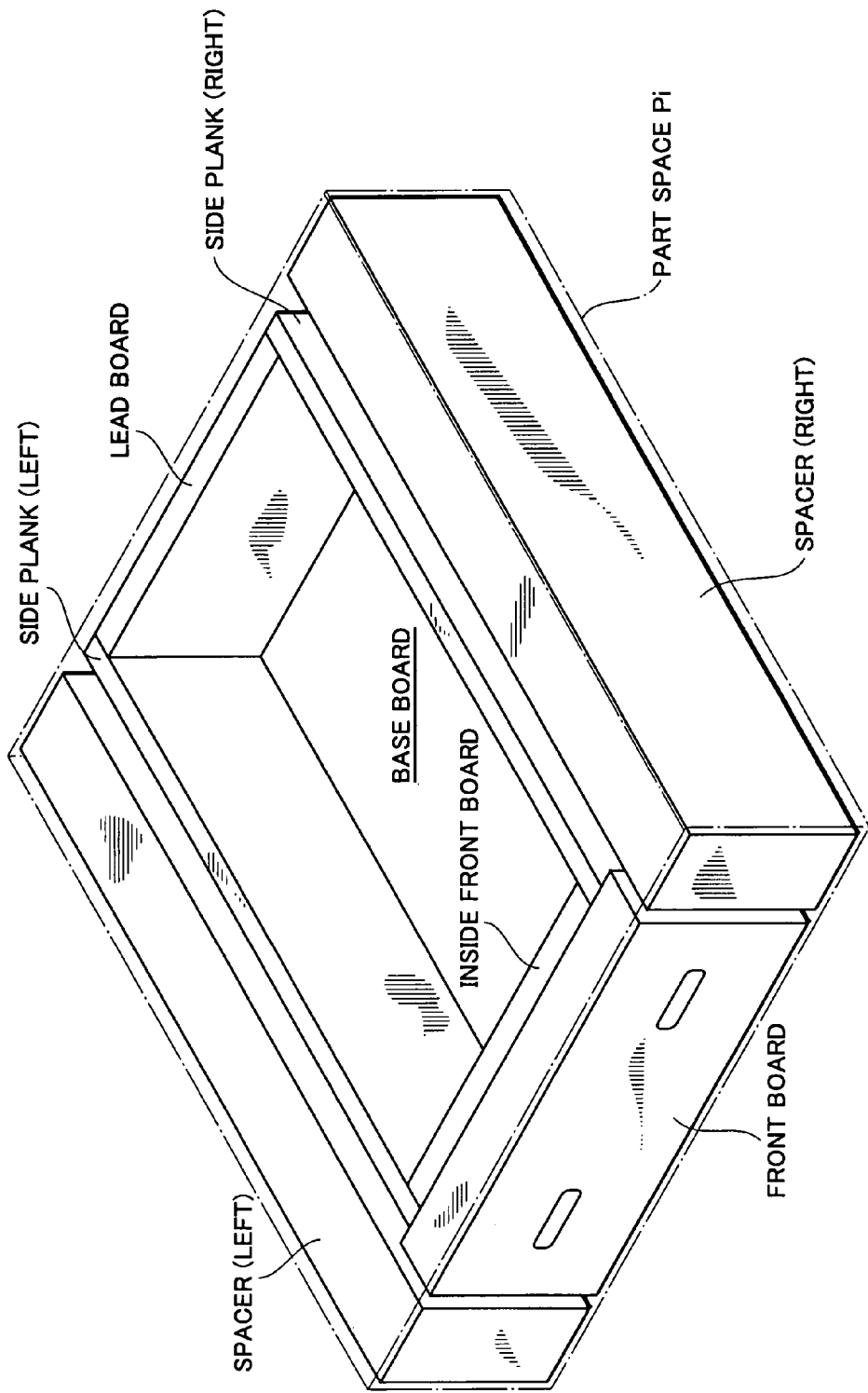
FIG. 9 illustrates the relationship between part space regarding an inset drawer and position of the an inset drawer in the part space.

FIG. 8 illustrates a hanger pipe H, which is one part, and a part space Ph regarding the hanger pipe H. FIG. 9 illustrates an inset drawer I, which is one part, and a part space Pi regarding the inset drawer I.

Parts are classified broadly into a part composed of a single structural member and a part composed of a plurality of structural members. The hanger pipe H (FIG. 8) is one part composed solely of a single structural member. The inset drawer I (FIG. 9) is one part composed of a plurality of structural members. A structural member of the smallest unit constituting a part shall be referred to as an "element" below. Since the hanger pipe is itself a structural member of the smallest unit, the hanger pipe H per se is an element. The inset drawer I is composed of a plurality of elements, as will be described later.

A part space P is defined for every part, as mentioned above. A part position is defined for the part space P by a relative position that uses the part space P as a reference.

The hanger pipe is composed of a single element, as mentioned above. A part composed of a single element has its part position and part dimensions decided by the thickness (or diameter) of the part and a position using as a reference any five surfaces among the six surfaces of the part space P, namely the top surface, bottom surface, left surface, right surface, front surface and back surface thereof.

With regard to the hanger pipe H, as shown in FIG. 8, the position of the top surface (upper end) of the hanger pipe is defined by distance "a" from the top surface of the part space Ph. Similarly, the positions of the left surface (left end), right surface (right end), front surface (front end) and back surface (back end) of the hanger pipe H are defined by distance "c" from the left surface of part space Ph, distance "d" from the right surface of part space Ph, distance "e" from the front surface of part space Ph and distance "f" from the back surface of part space Ph, respectively. The diameter w of the hanger pipe H also is defined. The position of the bottom surface (bottom end) of the hanger pipe H using the top surface of the part space Ph as a reference is defined by defining the diameter w of the hanger pipe H. The dimensions of the hanger pipe H also are decided by deciding the positions of the top surface, left surface, right surface, front surface and back surface of the hanger pipe H, the reference of which is the part space Ph, as well as the diameter of the hanger pipe.

A part composed of a plurality of elements as in the manner of the inset drawer I (FIG. 9) has the element position and dimensions of each of the plurality of elements defined by the relative position, the reference of which is the part space P, and the thickness of the element.

The inset drawer I illustrated in FIG. 9 is composed of eight elements, namely a front board, inside front board, lead board, side plank (left), side plank (right), base board, spacer (left) and spacer (right). Positions (element positions) and dimensions in a part space Pi are defined with regard to respective ones of these eight elements.

Figure 10:
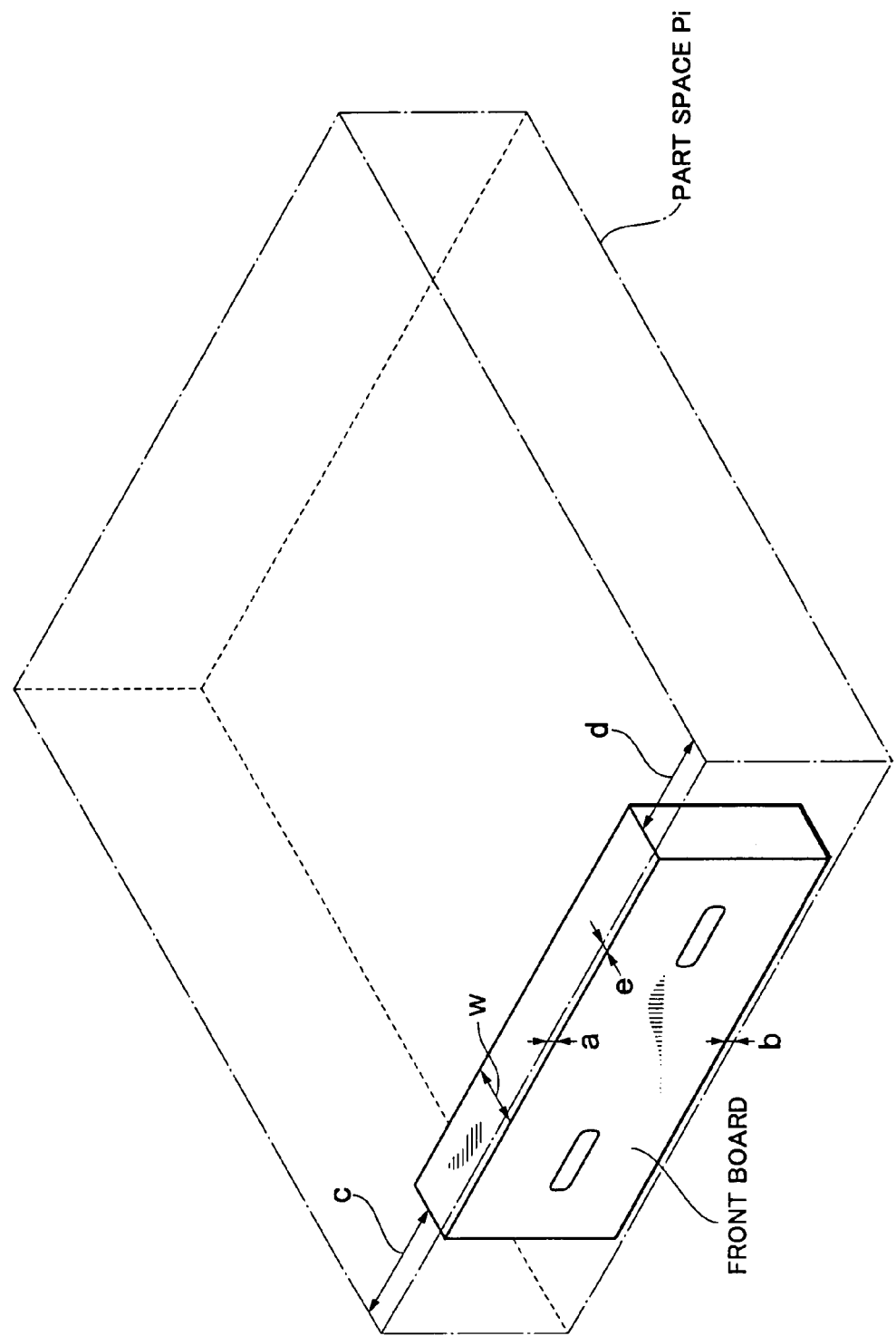
FIG. 10 illustrates the position, in part space, of a front board constituting an inset drawer.
Figure 11:
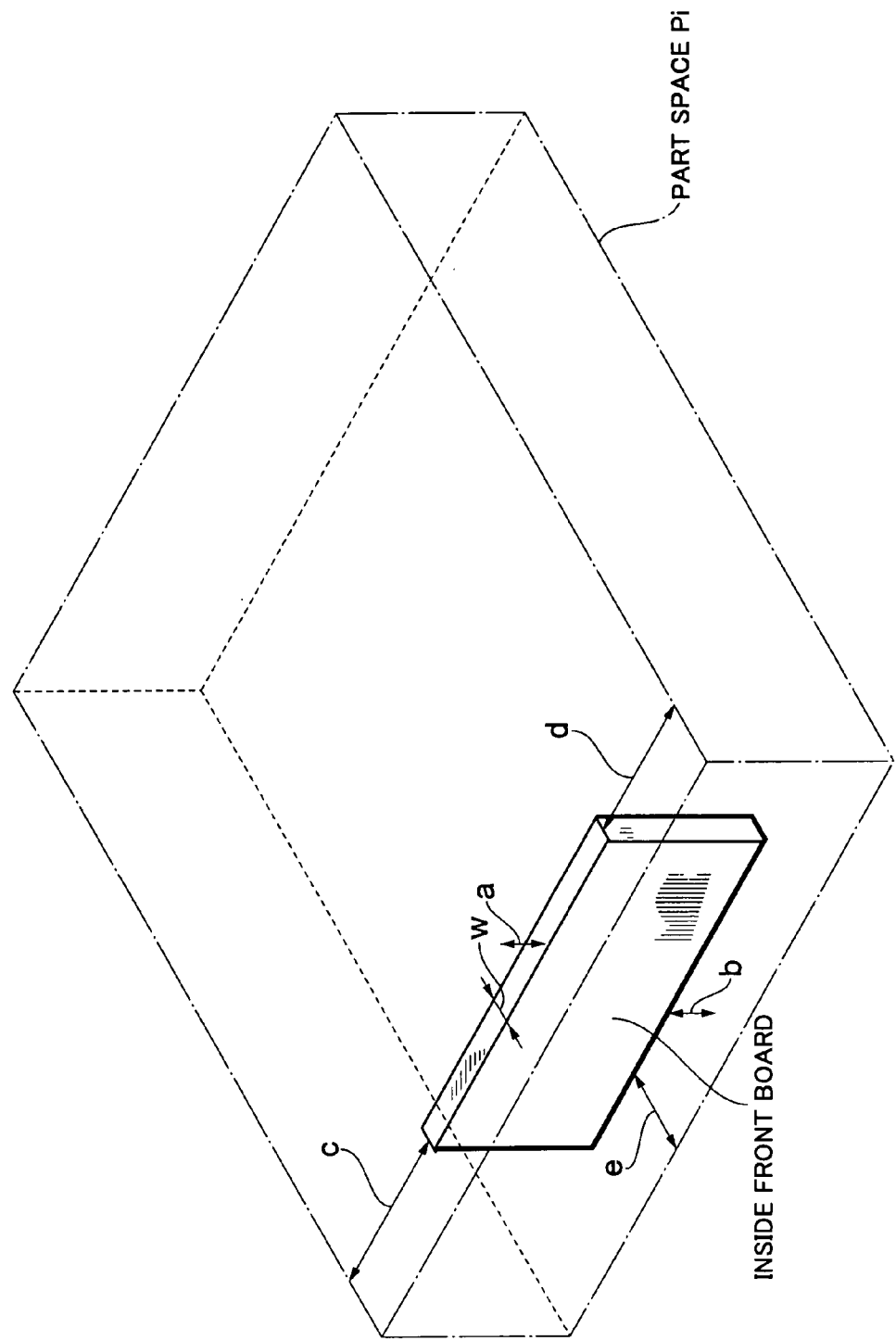
FIG. 11 illustrates the position, in part space, of an inside front board constituting an inset drawer.
Figure 12:
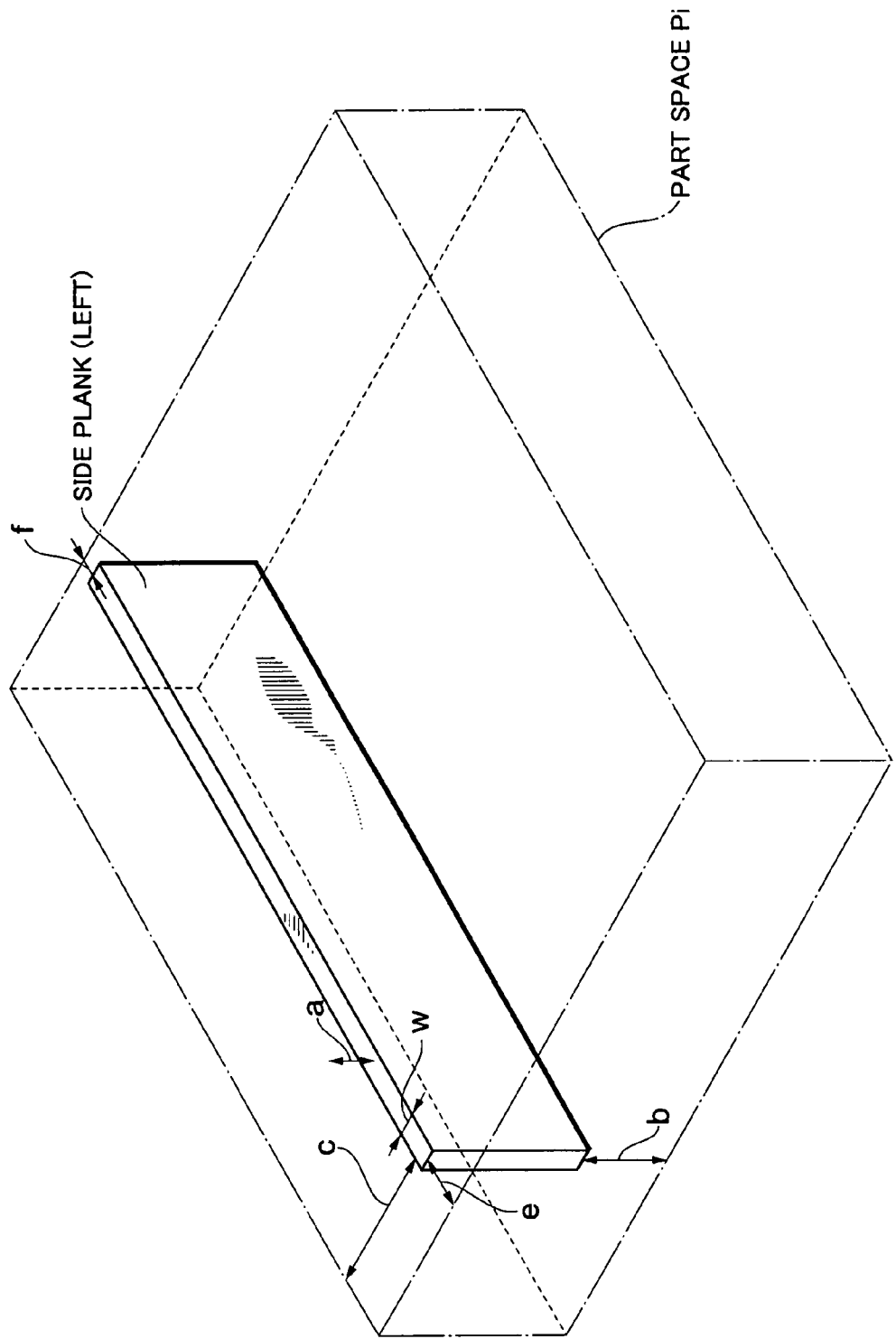
FIG. 12 illustrates the position, in part space, of a side plank (left) constituting an inset drawer.

FIG. 10 illustrates the position (dimensions) of the element "front board" in the part space Pi. FIG. 11 illustrates the position (dimensions) of the element "inside front board" in the part space Pi. FIG. 12 illustrates the position (dimensions) of the element "side plank (left)" in the part space Pi.

As shown in FIG. 10, the front board, which is one of the elements constituting the inset drawer I, has its position (dimensions) in the part space Pi defined by distance "a" from the top surface of part space Pi, distance "b" from the bottom surface thereof, distance "c" from the left surface thereof, distance "d" from the right surface thereof, distance "e" from the front surface thereof and thickness "w" of the front board. Position (dimensions) is defined in a similar manner with regard to the inside front board constituting the inset drawer I. The position (dimensions) in part space Pi is defined by distance "a" from the top surface of part space Pi, distance "b" from the bottom surface thereof, distance "c" from the left surface thereof, distance "d" from the right surface thereof, distance "e" from the front surface thereof and thickness "w" of the inside front board.

With regard to the side plank (left) (see FIG. 12) constituting the inset drawer I, the position (dimensions) of the side plank (left) in part space Pi is defined by distance "a" from the top surface of part space Pi, distance "b" from the bottom surface thereof, distance "c" from the left surface thereof, distance "e" from the front surface thereof, distance "f" from the back surface thereof and thickness "w" of the side plank (left).

With regard to the other elements [lead board, side plank (right), base board, spacer (left) and spacer (right)] constituting the inset drawer I as well, their positions (dimensions) in part space Pi are defined by the respective distances from any five surfaces among the top surface, bottom surface, left surface, right surface, front surface and back surface of part space Pi, and board thickness.

Thus, as described above, the position and dimensions of a part or element in part space P is defined by distances from respective ones of any five surfaces among the six surfaces constituting the part space P, and the thickness (diameter) of the part or element. Of course, the position and dimensions of a part or element in part space P can also be defined by the distances from respective ones of the six surfaces constituting the part space P.

4. Definition Data

The relative positional relationship (relative size relationship) between cell space S and part space P (FIGS. 6 and 7) and the relative positional relationship (relative size relationship) between part space P and a part (or each element constituting a part) (FIGS. 8 to 12) are defined by part-by-part definition data that has been stored in the definition database 26. Definition data will be described below taking the hanger pipe H and inset drawer I as examples.

FIG. 13 illustrates definition data regarding the hanger pipe H.

The definition data regarding the hanger pipe H includes cell space-part space linkage definition data (cell-space partitioning definition data) 71, part-space relative position definition data 72 and element definition data 73.

(1) Cell Space-Part Space Linkage Definition Data (Cell-Space Partitioning Definition Data) 71

As mentioned above, the cell space S is a three-dimensional space having the shape of a rectangular parallelepiped. Further, the part space P incorporated within the cell space S also is a rectangular parallelepiped. The cell space-part space linkage definition data 71 has an aspect that defines the handling of enlargement or reduction of part space P in a case where cell space S has been enlarged or reduced, and an aspect that decides whether cell space S is partitioned or position of the part space P is defined in linkage with cell space S in a case where cell space S in which part space P is incorporated is larger than part space P.

Figure 20:
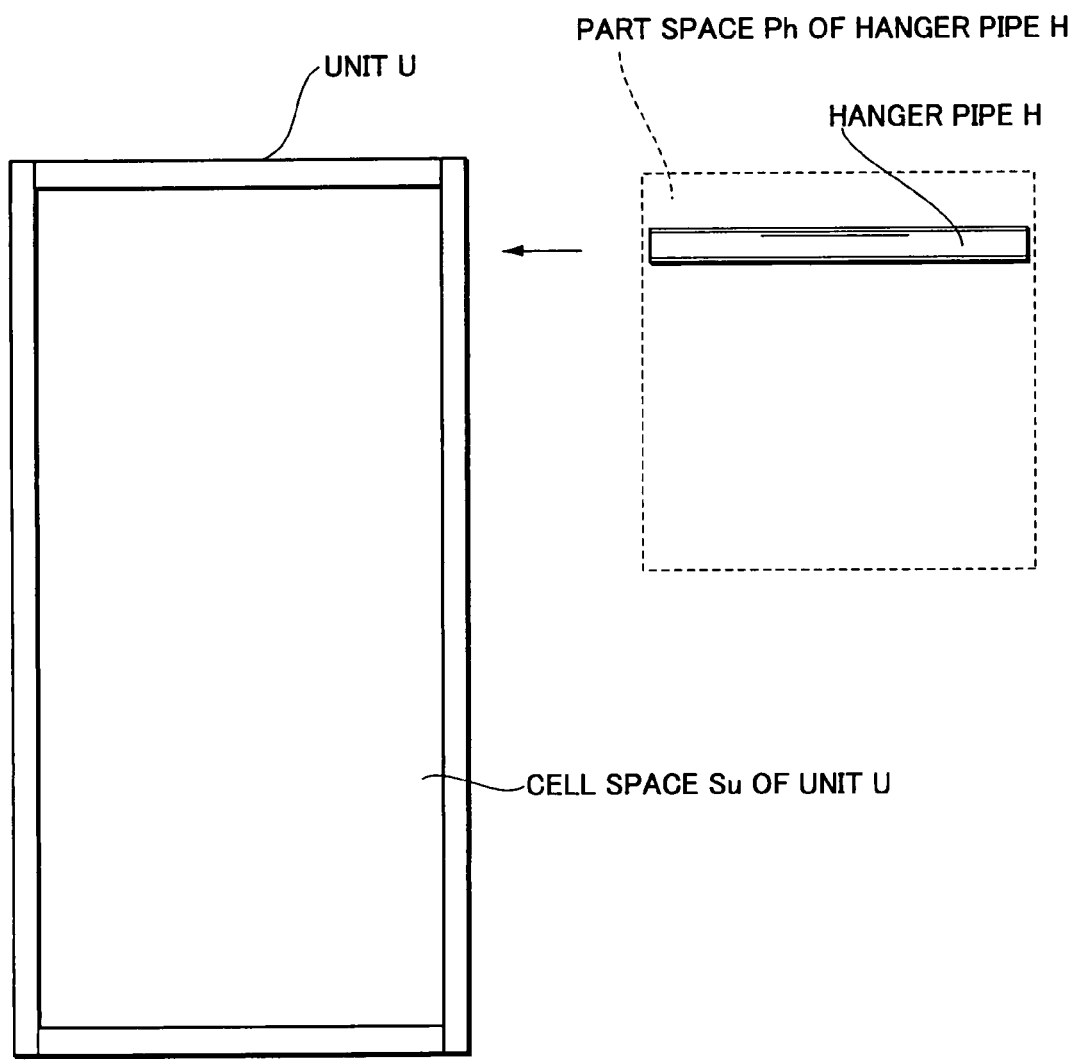
FIG. 20 illustrates the manner in which a hanger pipe is combined with a unit.
Figure 21:
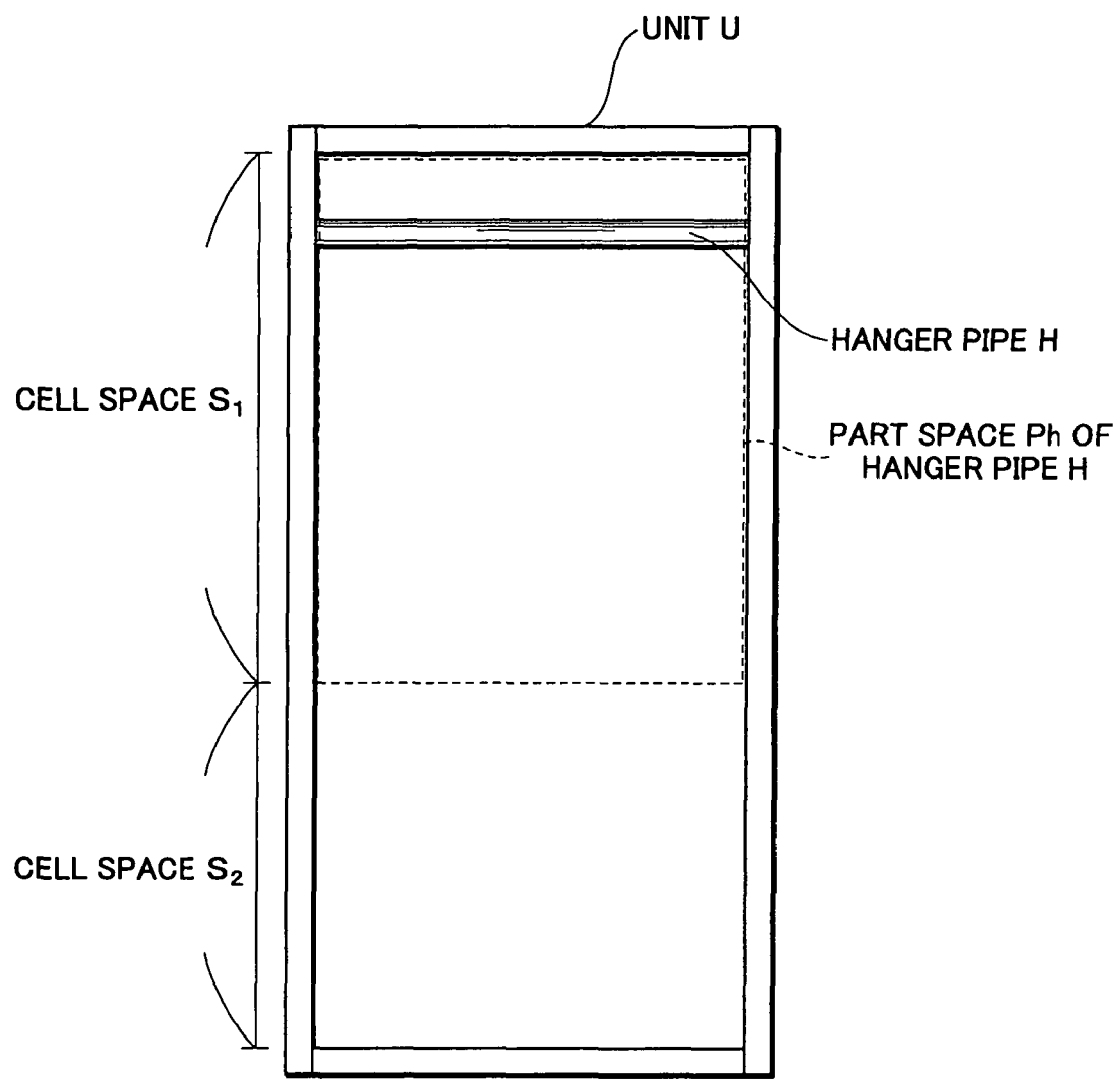
FIG. 21 illustrates the manner in which a hanger pipe is combined with a unit.

The above-mentioned partitioning of a cell space Su will be described with reference to FIGS. 20 and 21. FIGS. 20 and 21 illustrate an example when the hanger pipe H is incorporated in the cell space Su defined by a unit U.

The part space Ph has been defined for the hanger pipe H in the manner set forth above. If an operation for incorporating the hanger pipe H in the unit U is performed, the part space Ph of the hanger pipe H is correlated with the cell space Su of unit U.

At this time reference is had to the cell space-part space linkage definition data (cell-space partitioning definition data) 71 (FIG. 13) regarding the hanger pipe H. The cell space-part space linkage definition data (cell-space partitioning definition data) 71 of the hanger pipe H contains definition data "0" regarding the top surface, left surface, right surface, front surface and back surface, as well as definition data "1" regarding the bottom surface. The definition data "0" means that the surface of the part space that corresponds to a surface of the cell space is linked to the surface of the cell space. That is, with regard to the top surface, left surface, right surface, front surface and back surface, the positions of the top surface, left surface, right surface, front surface and back surface of part space Ph of hanger pipe H are decided in accordance with cell space Su. The positions of the top surface, left surface, right surface, front surface and back surface of part space Ph of hanger pipe H become relative positions (see FIGS. 6 and 7) with respect to the positions of the top surface, left surface, right surface, front surface and back surface of cell space Su.

Since definition data "1" has been stored with regard to the bottom surface, on the other hand, the bottom surface of the cell space Su of unit U and the bottom surface of the part space Ph of hanger pipe H are not linked. As illustrated in FIG. 21, the bottom surface of part space Ph becomes situated midway in the cell space Su (space Su shown in FIG. 20) (the position of the bottom surface of part space Ph is decided by the part-space relative position definition data 72, described later). At this time the cell space Su is partitioned. That is, the cell space Su is partitioned into a cell space S1 in which the part space Ph has been incorporated, and a cell space S2 situated beneath the bottom surface of part space Ph (FIG. 21).

The cell space S is capable of being enlarged or reduced in the direction of the top surface, direction of the bottom surface, direction of the left surface, direction of the right surface, direction of the front surface and direction of the back surface. The cell space-part space linkage definition data (cell-space partitioning definition data) 71 defines whether each surface of the part space P is to be enlarged or reduced in linkage with the corresponding surface of the cell space S, or left as is, when the cell space S has been enlarged or reduced.

According to the cell space-part space linkage definition data (cell-space partitioning definition data) 71 regarding the hanger pipe H shown in FIG. 13, the definition data "0" defining that surfaces of the part space are to be linked to surfaces of the cell space has been defined with regard to the top surface, left surface, right surface, front surface and back surface. In a state (FIG. 21) in which the hanger pipe H has been installed, therefore, if the unit U is enlarged or reduced in the height direction (direction of the top surface), width direction (direction of the left surface or direction of the right surface) or depth direction (direction of the front surface or direction of the back surface), then the top surface, left surface, right surface, front surface and back surface of the part space Ph also are enlarged or reduced in accordance with the enlargement or reduction of the top surface, left surface, right surface, front surface and back surface of the cell space S1. That is, with regard to the top surface, left surface, right surface, front surface and back surface of the part space Ph, the relative positions with respect to the positions of the top surface, left surface, right surface, front surface and back surface of the cell space S1 are maintained as is in accordance with the cell space-part space linkage definition data (cell-space partitioning definition data) 71.

On the other hand, with regard to the bottom surface in the cell space-part space linkage definition data (cell-space partitioning definition data) 71 concerning the hanger pipe H shown in FIG. 13, the definition data "1" defining that the surface of the part space is not linked to the surface of the cell space has been defined. Even if the part space Ph is enlarged or reduced in the height direction, the position of the bottom surface of part space Ph is not linked to the position of the bottom surface of cell space S1.

(2) Part-Space Relative Position Definition Data 72

The part-space relative position definition data 72 is data defining the relative position (see FIG. 7) of part space P using the cell space S as a reference. In case of the example illustrated in FIG. 21 described above, the cell space serving as the reference becomes the cell space S1 after the part space Ph regarding the hanger pipe H has been incorporated.

According to the part-space relative position definition data 72, relative position using the corresponding surface of the cell space S1 as a reference is defined with regard to a surface for which the definition data "0" has been defined in the cell space-part space linkage definition data (cell-space partitioning definition data) 71 described above.

For example, in the cell space-part space linkage definition data (cell-space partitioning definition data) 71 regarding the hanger pipe H shown in FIG. 13, the definition data regarding the top surface, left surface, right surface, front surface and back surface is "0" (linkage exists between the cell space and part space). With regard to the top surface, left surface, right surface, front surface and back surface of the part space Ph of hanger pipe H, the position of the part space Ph the reference of which is the cell space S1 is decided in accordance with the part-space relative position definition data 72. In the part-space relative position definition data 72, the definition data is "0" (mm) with regard to all of top surface, left surface, right surface, front surface and back surface. This means that the positions of the top surface, left surface, right surface, front surface and back surface of part space Ph coincide with the positions of the corresponding surfaces of cell space S1. Even if cell space S1 undergoes enlargement or reduction processing, the positions of the top surface, left surface, right surface, front surface and back surface of part space Ph will coincide with the positions of the corresponding surfaces of the cell space S1.

On the other hand, with regard to a surface for which the definition data "1" (no linkage between the cell space and part space) has been defined in the cell space-part space linkage definition data (cell-space partitioning definition data) 71 described above, distance (in millimeter units) from the corresponding surface of the cell space is specified in the part-space relative position definition data 72.

For example, in the cell space-part space linkage definition data (cell-space partitioning definition data) 71 regarding hanger pipe H shown in FIG. 13, the definition data regarding the bottom surface is "1" (no linkage between the dell space and part space). In this case, with regard to the bottom surface of part space Ph of the hanger pipe H, a position the reference of which is the surface of cell space S1 opposite the bottom surface of part space Ph, namely the top surface of the cell space S1, is defined in accordance with the part-space relative position definition data 72. In the part-space relative position definition data 72, the definition data regarding the bottom surface is "1000" (mm). The position of the bottom surface of the part space Ph will be the position of 1000 mm from the top surface of the cell space S1.

Since the hanger pipe H is for hanging an article of clothing such as a jacket, a prescribed space is always required below the hanger pipe H. By making the definition data regarding the bottom surface "1" (no linkage between the cell space and part space) in the cell space-part space linkage definition data (cell-space partitioning definition data) 71 of the hanger pipe H and defining the position of the bottom surface of the part space Ph regarding the hanger pipe H as the position of "1000" (mm) using the top surface of the cell space S1 as a reference, as described above, a prescribed space (a portion of the part space Ph) can always be provided below the hanger pipe H.

The fact that the dimensions of the part space Ph are also decided by deciding the positions of the top surface, bottom surface, left surface, right surface, front surface and back surface of the part space Ph is as set forth above.

(3) Element Definition Data 73

The element definition data 73 includes two kinds of definition data, namely part space-element linkage definition data (the upper half of the element definition data 73 shown in FIG. 13) and element relative-position definition data (the lower half of the element definition data 73 shown in FIG. 13).

In a case where the part space P has been enlarged or reduced, the part space-element linkage definition data contains data representing whether the top surface, bottom surface, left surface, right surface, front surface and back surface of an element are each to be enlarged or reduced in linkage with the part space P or left as is. Definition data "0" is stored with regard to a linked surface and definition data "1" with regard to a surface that is not linked.

The element relative-position definition data contains data representing the relative position of an element, which uses the part space P as a reference, and the thickness (diameter) of the element (see FIG. 8). Of the element relative-position definition data, the data representing the thickness (diameter) of the element is a section regarding a surface corresponding to the surface for which the definition data "1" has been stored in the part space-element linkage definition data.

By way of example, according to the element definition data 73 regarding the hanger pipe H shown in FIG. 13, definition data "1" regarding the bottom surface has been stored in the part space-element linkage definition data in the upper half of the data 73. In this case, the data stored in the "BOTTOM SURFACE" section in the element relative-position definition data in the lower half of the data 73 is a value representing the diameter of the element (here the hanger pipe H).

With regard to surfaces (top surface, left surface, right surface, front surface and back surface) other than the bottom surface of the hanger pipe H, data representing relative positions using as a reference the top surface, left surface, right surface, front surface and back surface of the part space Ph is stored.

FIGS. 14 to 19 illustrate definition data regarding the inset drawer I.

In a manner similar to the hanger pipe H, the inset drawer I also involves cell space-part space linkage definition data (cell-space partitioning definition data) 81, part-space relative position definition data 82 and element definition data 83A to 83H. Since the inset drawer I is composed of eight elements, namely the front board, inside front board, lead board, side plank (left), side plank (right), base board, spacer (left) and spacer (right), element definition data regarding the inset drawer I is provided for each of these eight elements (the data at reference characters 83A to 83H).

Furthermore, additional-information definition data 84 is included with regard to the inset drawer I, as illustrated in FIG. 19. The additional-information definition data 84 defines automatic provision of a shelf board and automatic omission of a shelf board. In the inset drawer I, a shelf board is provided either as the top surface or bottom surface of the part space Pi (see FIG. 9) regarding the inset drawer I. In a case where the inset drawer I has been incorporated in the cell space S (a case where the part space Pi of the inset drawer I has been incorporated in the cell space S), whether or not a shelf board is to be provided above the part space Pi is defined in "SHELF BOARD NECESSARY OR NOT (ABOVE)". Definition data "1" is stored if the shelf board is to be provided and definition data "0" if the shelf board is not to be provided. Similarly, whether or not a shelf board is to be provided below the part space Pi is defined in "SHELF BOARD NECESSARY OR NOT (BELOW)".

For example, if two parts A, B are incorporated in a unit in such a manner that part B for which definition data "1" has been stored in "SHELF BOARD NECESSARY OR NOT (BELOW) is situated above part A for which definition data "1" has been stored in "SHELF BOARD NECESSARY OR NOT (ABOVE)", then a shelf board serving as the bottom surface of the part space P of part A and a shelf board serving as the top surface of the part space P of part B will represent a redundancy (i.e., double shelf boards will be defined between part A and part B). One of the shelf boards may be dispensed with in such case. When a state in which double shelf boards have been provided arises, definition data ("1", meaning omit; "0", meaning do not omit), which represents whether the shelf board constituting the top surface of the part space P is to be omitted or not, is stored in "OMIT SHELF BOARD (ABOVE)". When a state in which double shelf boards have been provided arises, definition data, which represents whether the shelf board constituting the bottom surface of the part space P is to be omitted or not, is stored in "OMIT SHELF BOARD (BELOW)".

The furniture design support apparatus utilizes the concept of cell space S and part space P in the design of furniture, as mentioned earlier. The part space P has its position and dimensions defined by relative position using the cell space S as the reference. As a result, it is easy to enlarge or reduce the part space P automatically in accordance with enlargement or reduction of the cell space S. Further, whether or not enlargement or reduction of the part space P in conformity with enlargement or reduction of the cell space S is to be performed (i.e., whether there is linkage or not) is defined independently with regard to each of the top, bottom, left, right, front and back surfaces. This means that an article of furniture can be designed in a flexible manner.

Furthermore, a part (a plurality of elements that construct a part) has its position and dimensions defined by a relative position, which uses the part space P as a reference, and part thickness. It is easy to enlarge or reduce a part (or element) in accordance with the part space P enlarged or reduced in linkage with enlargement or reduction of the cell space S. Also with regard to whether or not enlargement or reduction of an element in conformity with enlargement or reduction of the part space P is to be performed (i.e., whether there is linkage or not), this is defined independently with regard to each of the top, bottom, left, right, front and back surfaces. Definition conforming to the features of a part can be achieved.

Further, since position in part space P is defined element by element, the above-described definition data can be created with regard to various parts composed of a plurality of elements. Regardless of the kind of part, the data structure per se of the definition data is identical. This facilitates the addition, deletion and modification of definition data.

It may be so arranged that input of the above-described part-by-part definition data and storage of the data in the definition database 26 is performed by a definition-data input program prepared separately of the furniture design support program.

5. Operation of Furniture Design Support Apparatus

Figure 22:
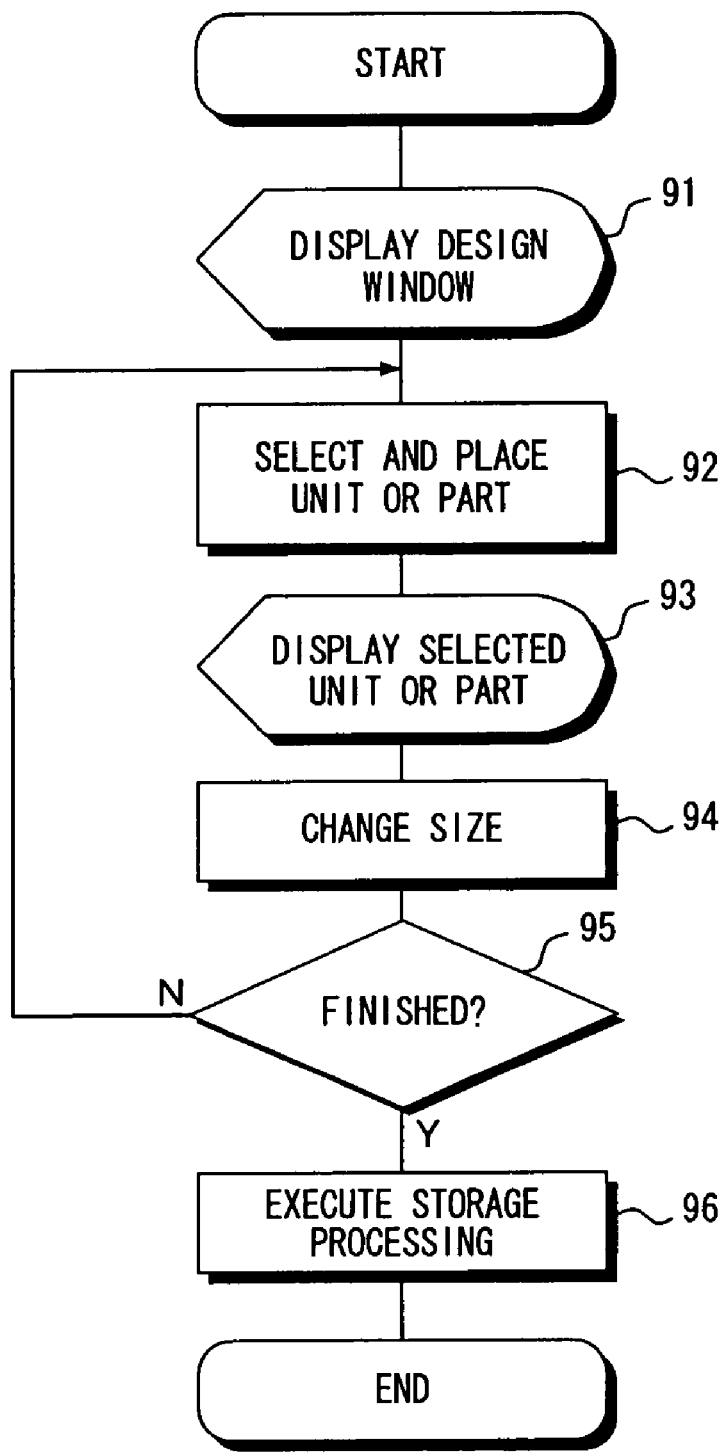
FIG. 22 is a flowchart illustrating the basic operational flow of a furniture design support apparatus.

FIG. 22 is a flowchart illustrating the basic processing flow of the furniture design support apparatus. FIGS. 23 to 28 illustrate windows displayed on the display screen of the display unit 11 of the furniture design support apparatus. These show the transition of screens that display processing flow when an article of furniture is designed. The basic flow of design of an article of furniture in the furniture design support apparatus will be described from the standpoint of the display on the display screen with reference to FIGS. 22 to 28.

Figure 23:
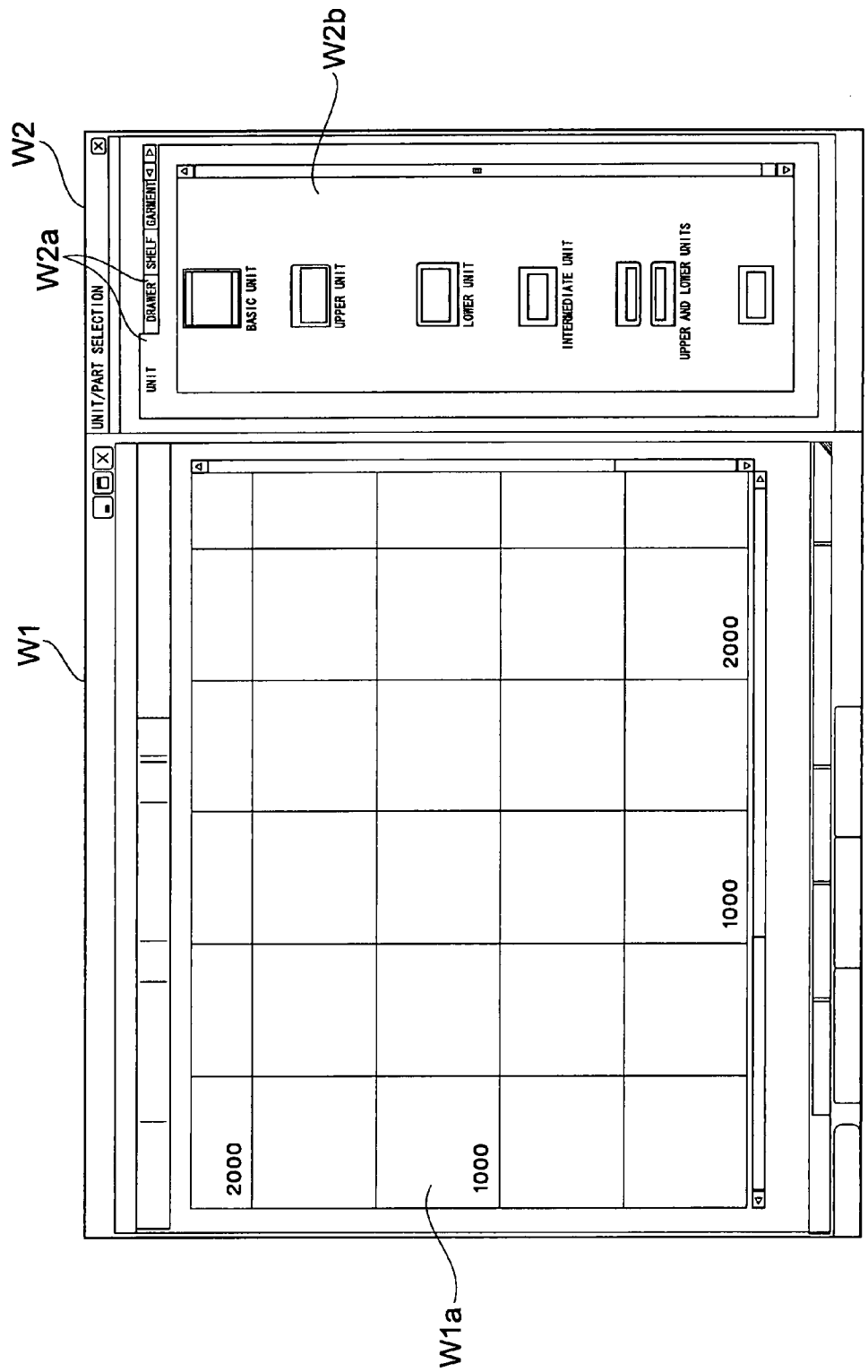
FIG. 23 illustrates a display screen in a furniture design support apparatus.

The user (operator) of the furniture design support apparatus employs the mouse 13 to start up the furniture design support program stored on the hard disk. When this is done, a basic window W1 is displayed on the display screen of the display unit 11 (FIG. 23). A unit/part selection window W2 also is displayed on the display screen in response to start-up of the furniture design support program (the basic window W1 and unit/part selection window W2 will be referred to generically as "design windows) (step 91). The basic window W1 and unit/part selection window W2 constituting the design windows are formed as separate windows.

The major portion of the basic window W1 is occupied by a furniture display area W1a. The image of an article of furniture (inclusive of an article of furniture in the process of being assembled) is displayed in the furniture display area W1a, as will be described later.

A plurality of selection tags W2a are formed at the top of the unit/part selection window W2, and a unit/part display area W2b is formed underneath the plurality of selection tags W2a. Characters such as "UNIT", "DRAWER", "SHELF" and "GARMENT RACK" are displayed in the plurality of selection tags W2a. The selection tags W2a are clickable using the mouse 13.

By way of example, if the "UNIT" selection tag W2a is clicked, images representing units of a plurality of types and character strings representing the unit names (names of the unit types) are displayed one above the other vertically in the unit/part display area W2b (FIG. 23).

Figure 24:
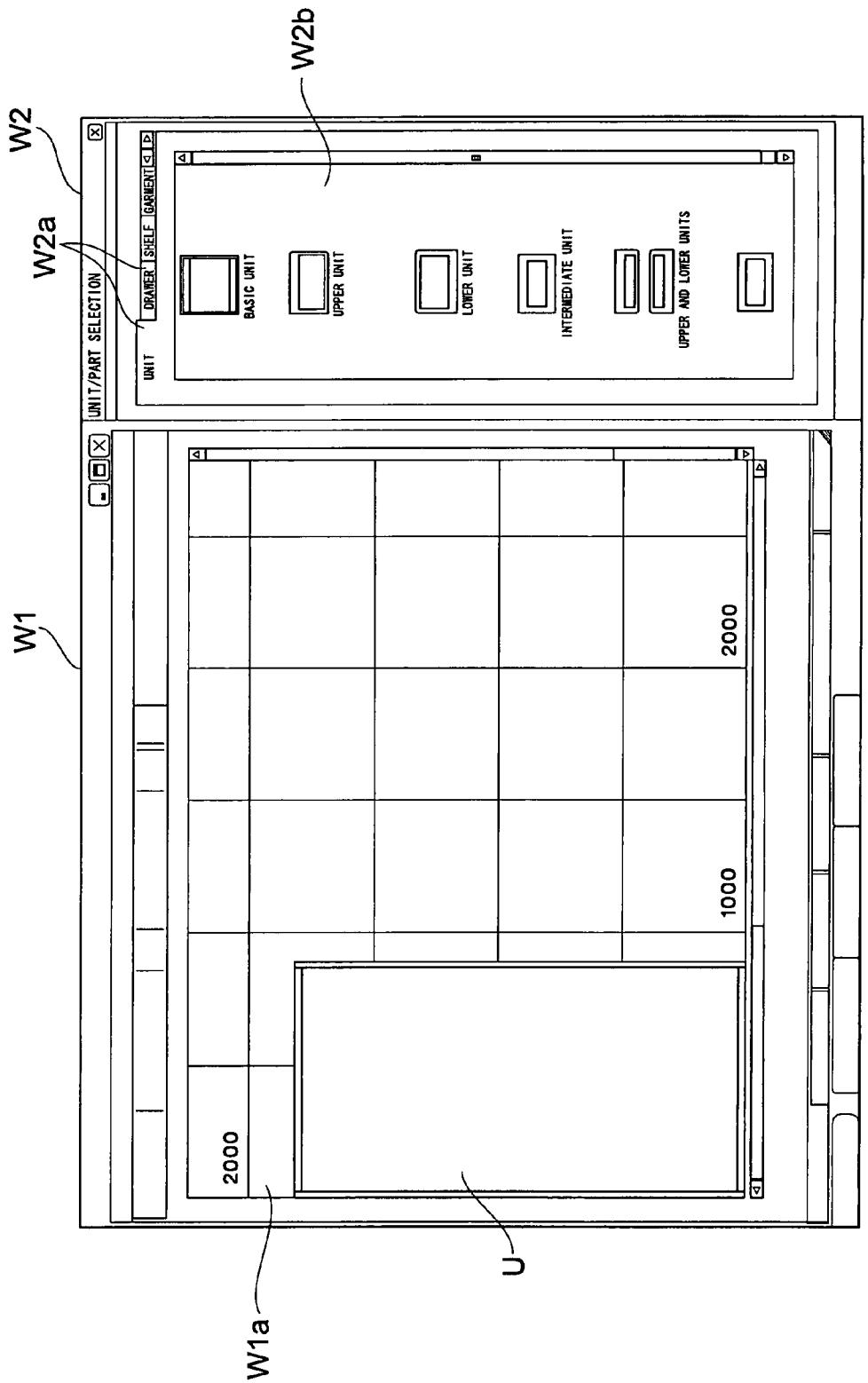
FIG. 24 illustrates a display screen in a furniture design support apparatus.

The image of the basic unit is clicked using the mouse 13 and is dragged to the furniture display area W1a. When this is done, the image representing the selected basic unit is displayed in the furniture display area W1a (FIG. 24; steps 92, 93).

The basic unit displayed in the furniture display area W1a has preset standard dimensions (height, width and depth), whereby the size of a cell space S in an initial state is defined. The height-direction and width-direction dimensions of unit U can be changed using the mouse 13. Further, the height, width and depth dimensions can also be changed using a window (not shown) representing separately displayed height, width and depth by numerical values (step 94). If height, width and depth are changed, the shape of the basic unit U displayed in the furniture display area W1a is changed in hanger pipe H is clicked and selected using the mouse 13 and is dragged to the cell space of basic unit U being displayed in the furniture display area W1a, then the hanger pipe H is added to and displayed in the cell space Su of the basic unit U ("NO" at step 95; steps 92, 93).

When the hanger pipe H is incorporated in the cell space Su, the single cell space Su formed by the basic unit U is partitioned into two areas (two cell spaces S1, S2) (see FIG. 21), in the manner described above. The part space Ph regarding the hanger pipe H is placed in the cell space S1. Dimensions regarding the respective cell spaces S1 and S2 are stored in memory 18. Further, the part space Ph of hanger pipe H incorporated in cell space S1 takes on a position and dimensions that are in accordance with the part-space relative position definition data 72 (FIG. 13) regarding the hanger pipe H. The fact that cell space S1 and part space Ph have been correlated is stored in memory 18.

It should be noted that the position at which the hanger pipe H is mounted in the cell space of the basic unit U (the mounting position along the height direction) can be made a different position in accordance with the position along the height direction prevailing when the such a manner that the unit will have the height and width of the changed dimensions. Of course, data representing the dimensions (height, width and depth) of the basic unit U and data representing the dimensions (height, width and depth) of the cell space S are changed in the memory 18 in accordance with a change in the shape (dimensions) of the basic unit U.

A change in height corresponds also to movement of both the top board and bottom board of the basic unit U. A change in width corresponds also to movement of both the left side board and right side board, and a change in depth corresponds also to movement of both the front board and back board.

A part is provided (placed) within the cell space Su defined by the basic unit U.

Figure 25:
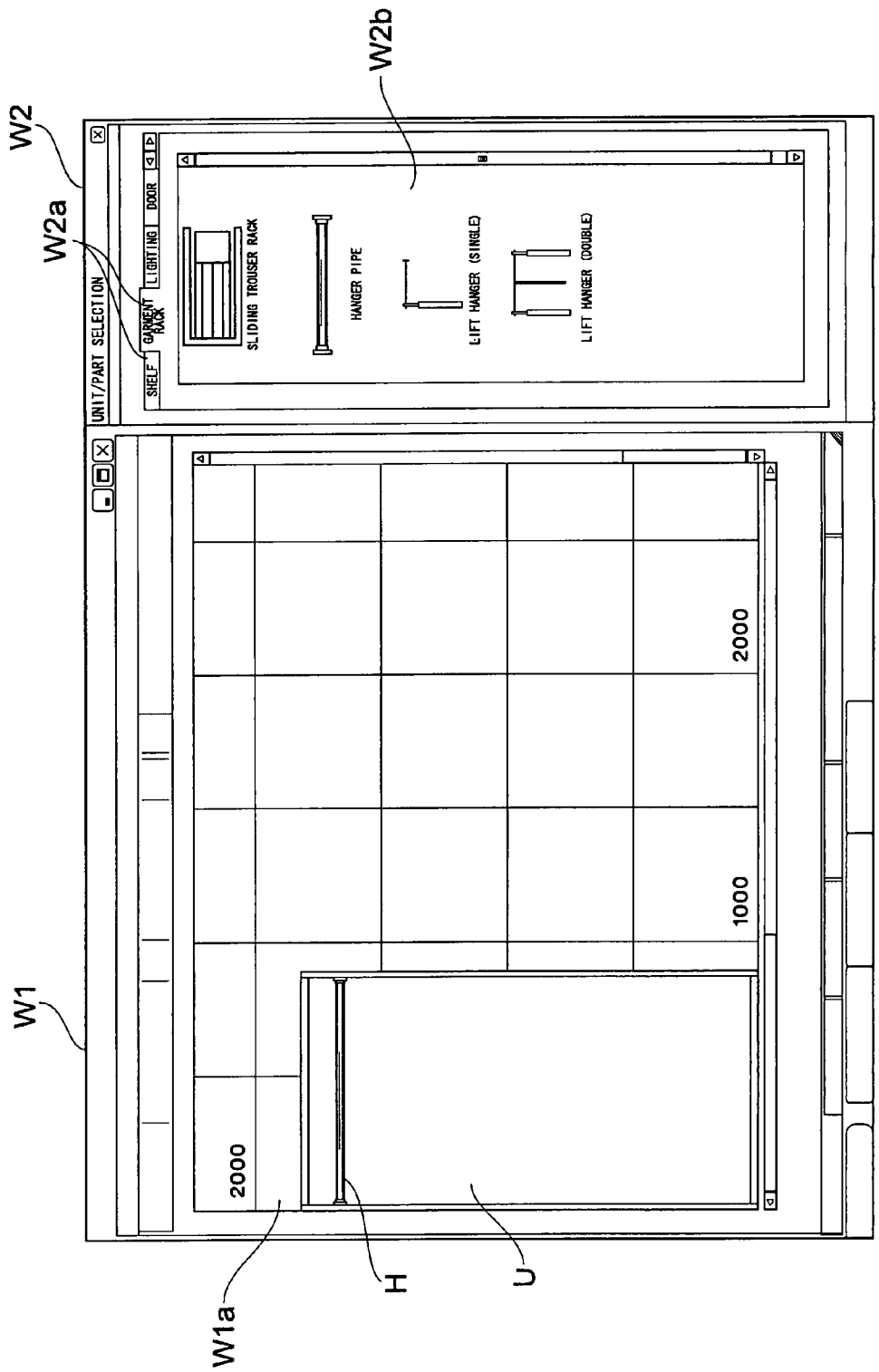
FIG. 25 illustrates a display screen in a furniture design support apparatus.

For example, in a case where the hanger pipe H is provided within the cell space Su of basic unit U, the "GARMENT RACK" selection tag W2a is selected in the unit/part selection window W2 (FIG. 25). In accordance with the selection of the "GARMENT RACK" selection tag W2a, images of garment racks of a plurality of types that include the image of the hanger pipe H are displayed in the unit/part display area W2b. If the image of the hanger pipe H is dragged to the cell space S of the basic unit U. Naturally, once the hanger pipe H has been incorporated in the cell space Su of basic unit U at any position in the cell space, the position of the hanger pipe H along the height direction can also be adjusted (moved) subsequently using the mouse 13. Furthermore, in the case of an actual article of furniture, the left and right side boards of the basic unit U are provided along the vertical direction with equally spaced dowel holes and the hanger pipe is mounted at the position of the dowel holes. The positions of the dowel holes may be defined beforehand in the data regarding the basic unit. In this case, the hanger pipe H will be incorporated at the defined positions of the dowel holes.

However, the hanger pipe H cannot be incorporated at such a height position in the cell space Su that the bottom surface of the part space Ph regarding hanger pipe H will be situated below the bottom surface of the cell space Su. The reasons for this is as follows: As mentioned above, the fact that the bottom surface of the part space Ph is not linked to the bottom surface of the cell space has been defined in the cell space-part space linkage definition data 71 (FIG. 13) regarding the hanger pipe H, and the fact that a prescribed space is provided below the hanger pipe H has been defined in the part-space relative position definition data 72 regarding the hanger pipe H. If it is attempted to incorporate the hanger pipe H at such a height position in the cell space Su that the bottom surface of the part space Ph of hanger pipe H will exceed and be situated below the bottom surface of the cell space Su, then an error message (not shown) is displayed (or the operation is refused). The reason is that the hanger pipe H is used in order to hang a jacket and it is always necessary to provide space below the hanger pipe H. Thus, the part-space relative position definition data causes the characteristics of the part to be reflected in the design of the article of furniture (i.e., in the design limitations). This prevents the designing of an article of furniture in which the hanger pipe H is provided at a height position that is too low to enable the hanging of clothing.

If the dimensions of the basic unit U in which the hanger pipe H has been incorporated are changed (step 94), the part space Ph regarding the hanger pipe H is enlarged or reduced in conformity with the enlargement or reduction of the cell space S1 in accordance with the cell space-part space linkage definition data 71 (FIG. 13) that has been defined with regard to the hanger pipe H, as mentioned above. Further, in accordance with the element definition data 73 (FIG. 13), the position (image position) of the hanger pipe H moves attendant upon the enlargement or reduction of the part space Ph and the dimensions (image dimensions) also are enlarged or reduced.

The cell space Su in the initial state defined by the basic unit U is partitioned into the two cell spaces S1, S2 owing to the incorporation of the hanger pipe H, as described above. The cell space S1 is occupied by the part space Ph of hanger pipe H. Since the cell space and part space are in one-to-one correspondence, another part cannot be further incorporated in the cell space S1 occupied by the part space Ph.

On the other hand, the part space P is not incorporated in the cell space S2 (data representing the fact that the part space P has not yet been correlated with the cell space S2 may be stored in memory 18). Another part can be incorporated in the cell space S2.

Figure 26:
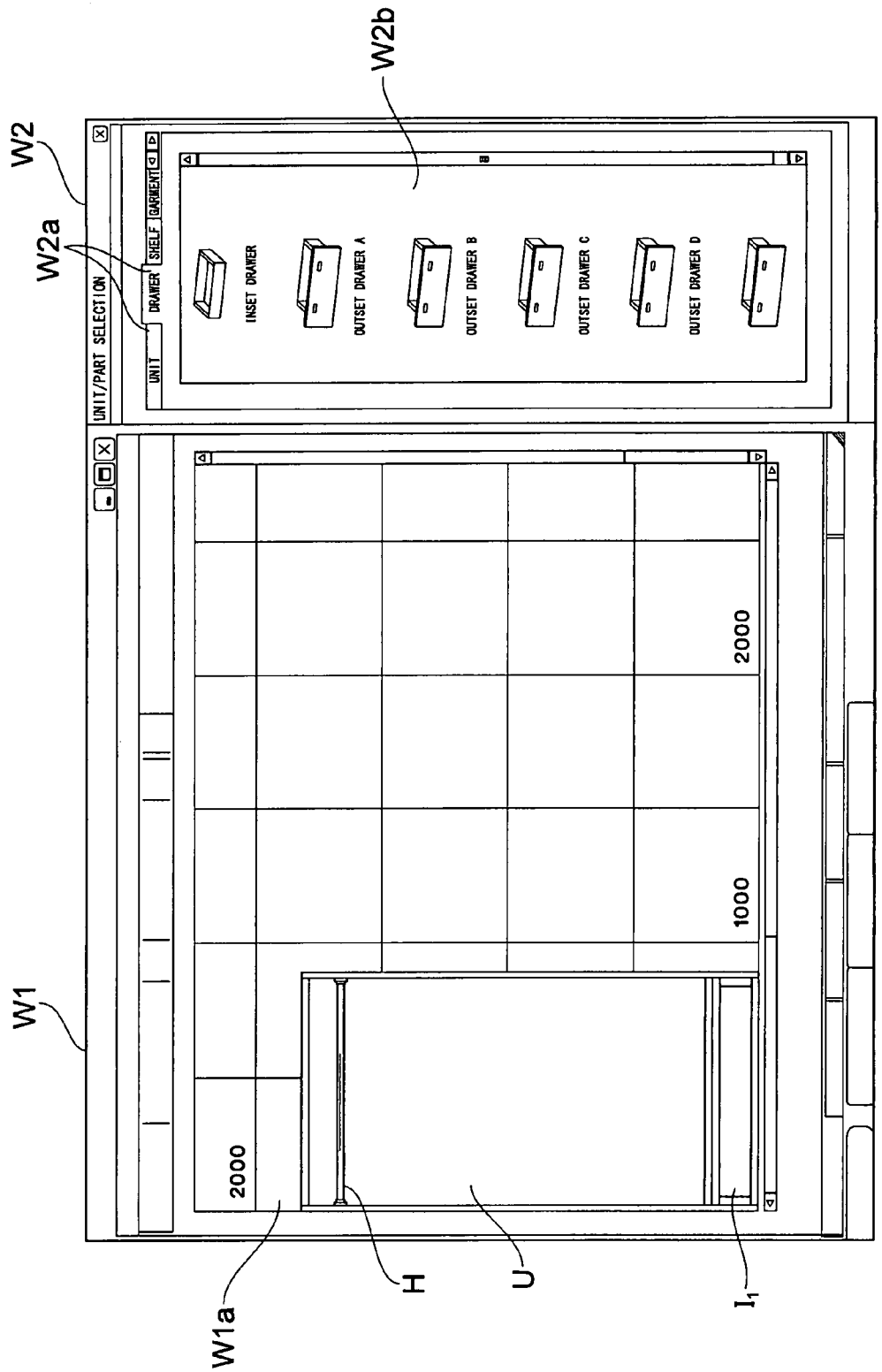
FIG. 26 illustrates a display screen in a furniture design support apparatus.

In a case where the inset drawer I is incorporated in the cell space S2, the "DRAWER" selection tag W2a is clicked in the unit/part selection window W2. Drawer images of a plurality of types inclusive of the inset drawer are displayed in the unit/part display area W2b. If the inset drawer is clicked and dragged below the cell space S2, then an inset drawer I1 is added to and displayed in the cell space of the basic unit U (FIG. 26; steps 92, 93). The cell space S2 is further partitioned into two portions, one of which is occupied by the part space regarding the inset drawer I1.

Figure 27:
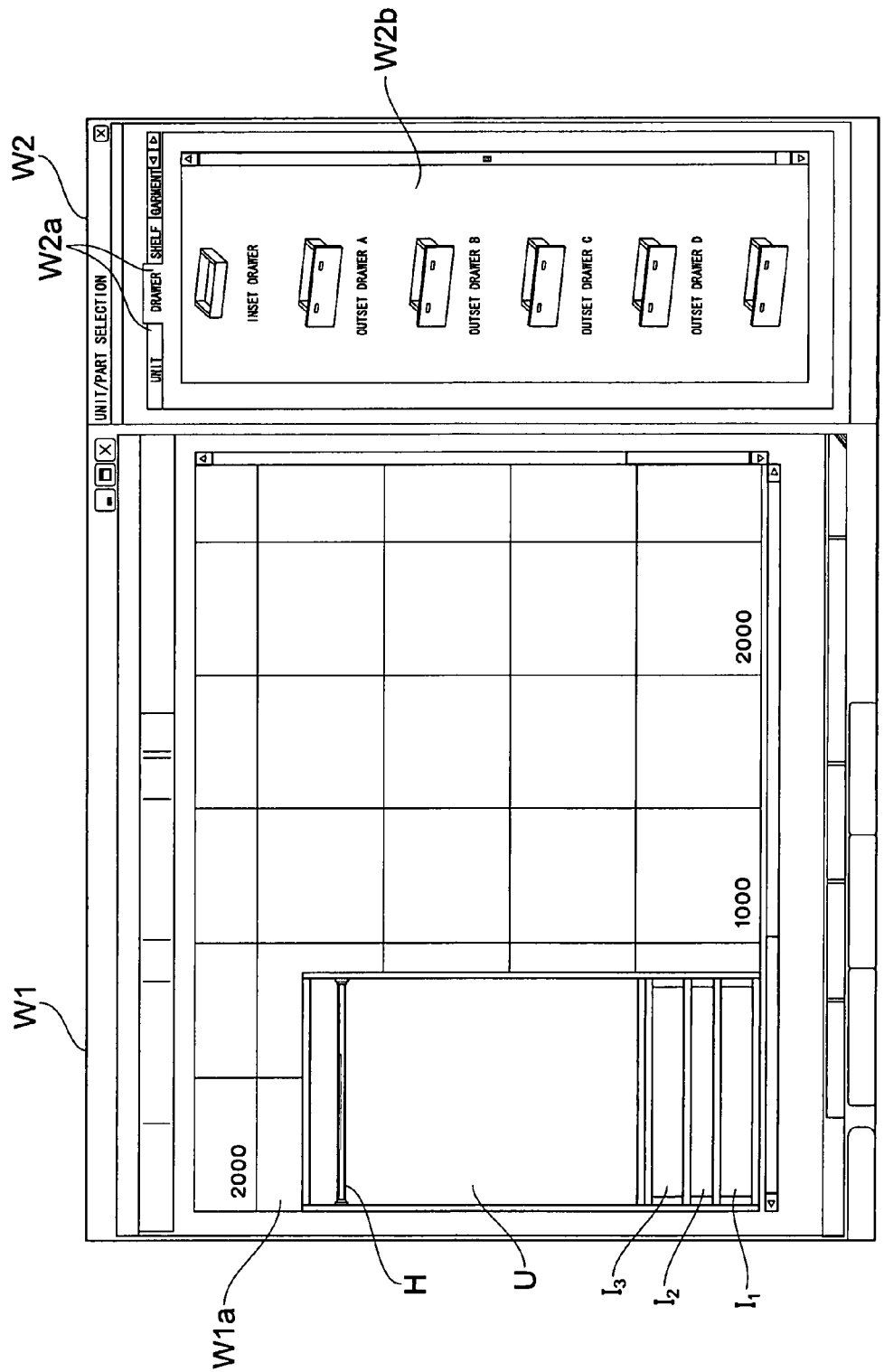
FIG. 27 illustrates a display screen in a furniture design support apparatus.

By repeatedly performing the dragging of the inset drawer I three times, three levels of inset drawers I1, I2, I3 arranged in the height direction within the cell space of basic unit U are added on and displayed (FIG. 27). Cell spaces S2, S3, S4 are defined (see FIG. 5).

Figure 28:
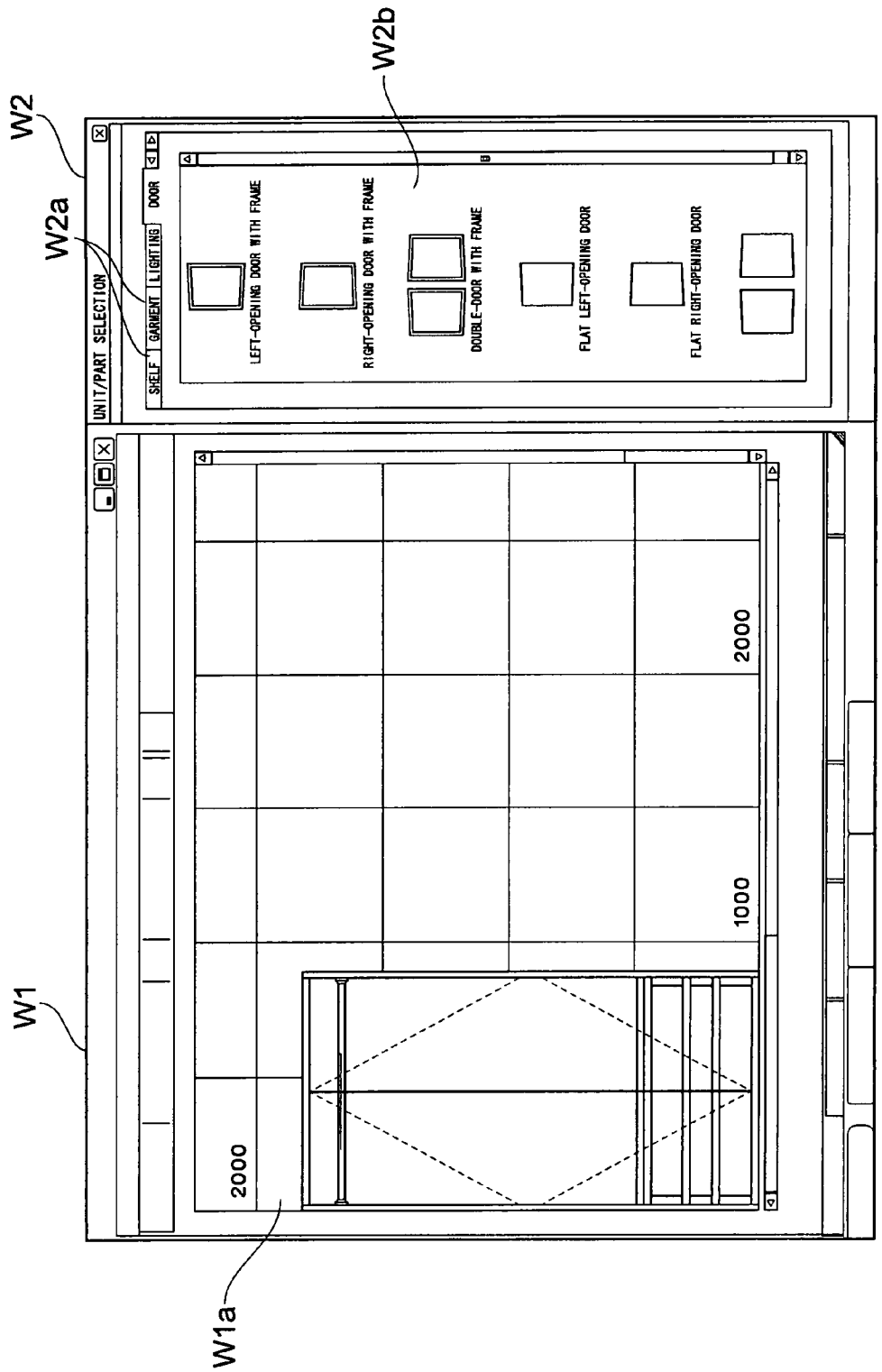
FIG. 28 illustrates a display screen in a furniture design support apparatus.

Furthermore, in a case where a double door is placed at the front surface of the basic unit U, a "DOOR" selection tag W2a is selected in the unit/part selection window W2 and a double door [here a flat door (double door)] displayed in the unit/part display area W2b is selected. If the flat door (double door) is dragged, then the flat door (double door) is added to and displayed at the front surface of the basic unit U (FIG. 28). The double door is not a part having a part space and is treated as an accessory part.

If storage processing is executed, the name of the unit (or symbols identifying the selected unit) constituting the article of furniture (which may be in the process of being completed) displayed in the furniture display area W1a, the name of the part (symbols identifying the part), position and dimensions of the cell space and data representing the correlation between the cell space and part space are stored in the furniture design database 25 ("YES" at step 95; step 96). A detail drawing of the article of furniture displayed on the display screen, the price, the dimensions and quality of the units constructing the article of furniture and parts, etc., are displayed on the display screen and printed from the printer 17 as necessary.

Finally, processing for rendering a detail drawing (which may also be referred to as a design drawing or dimensions drawing) of units and parts constructing an article of furniture will be described. A furniture maker who actually fabricates an article of furniture designed by a furniture designer using the furniture design support apparatus works the lumber, etc., and fabricates each of the units and parts constructing the designed article of furniture in accordance with the detail drawing (design drawing or dimensions drawing) of the units and parts constructing the article of furniture.

As mentioned above, a unit has a cell space in the shape of a rectangular parallelepiped, and a part space regarding a selected part is correlated with this cell space. The positions of the six surfaces of the part space are specified by part-space relative position definition data (see FIGS. 12 and 13) using the corresponding six surfaces of the cell space as a reference. Furthermore, the positions of the five surfaces of a part (or element constituting the part) in the part space are specified by the element definition data (see FIG. 12 and FIGS. 13 to 18) using the corresponding five surfaces of the part space as a reference. The position of the remaining surface also is specified by a definition of the thickness of the element in the element definition data. Accordingly, if the size of the cell space is decided, then the dimensions of a part (or element) also are decided.

Figure 29:
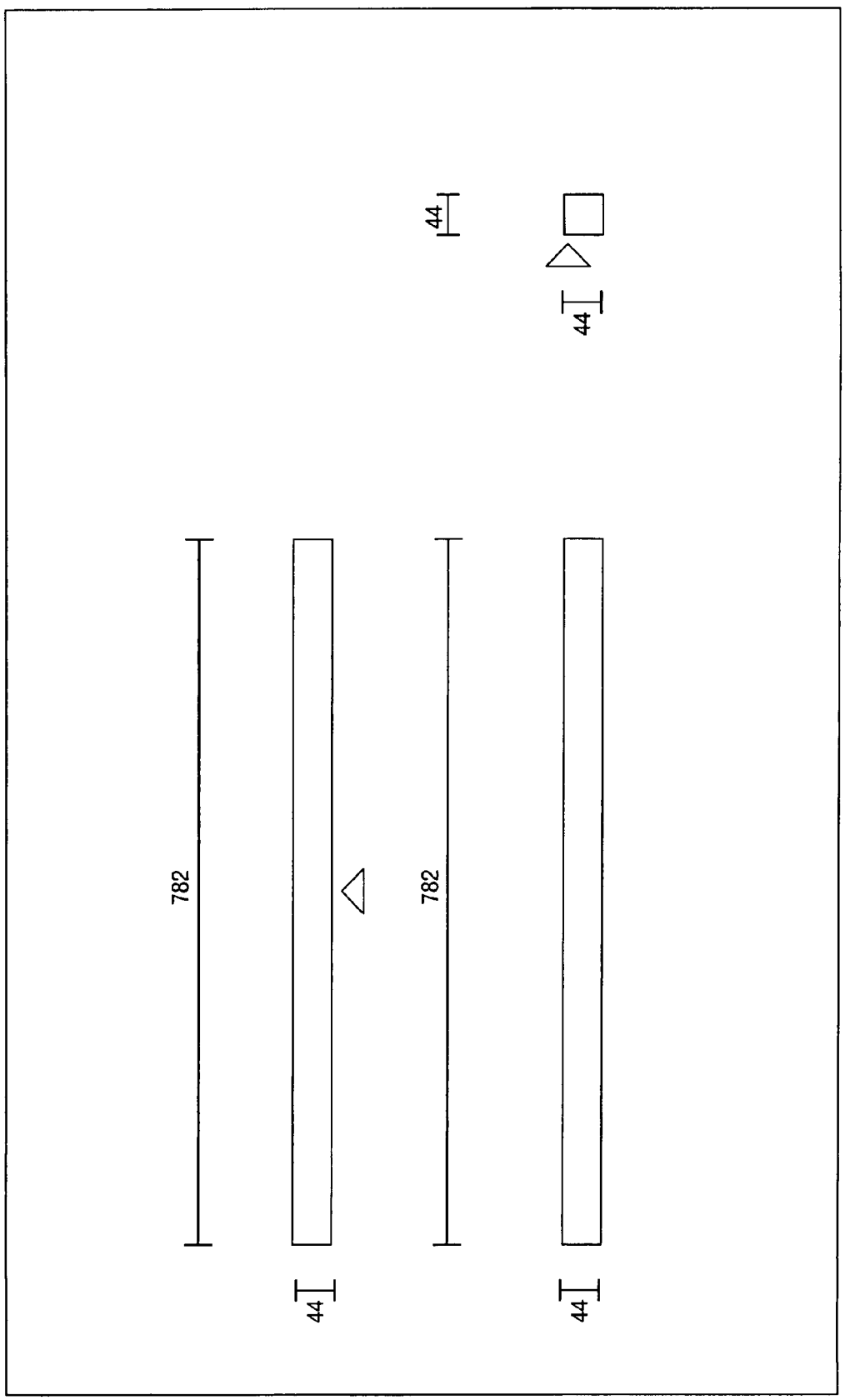
FIG. 29 illustrates a detail drawing of a hanger pipe.

FIG. 29 illustrates an example of a detail drawing (design drawing or dimensions drawing) regarding a hanger pipe created using a cell space, part-space relative position definition data and element definition data. A top view (plan view), front view and right-side view of the hanger pipe are illustrated in the detail drawing together with the dimensions. All detail drawings created using the part-space relative position definition data and element definition data are displayed in the form of rectangular shapes. The reason is that the part-space relative position definition data and element definition data has been created so as to decide the positions of the six surfaces of part space and the positions of the six surfaces of a part (or element). For example, even though a part is a cylindrically shaped hanger pipe, the right-side view thereof is displayed as a rectangle, as illustrated in FIG. 29, in a case where use is made solely of the part-space relative position definition data and element definition data.

In a case where it is necessary to render a detail drawing more accurately (e.g., a case where a hanger pipe is cylindrical and the right-side view thereof is rendered as a circle in the detail drawing regarding this cylindrically shaped hanger pipe), part (element) detail-drawing rendering definition data is prepared, part by part and element by element, on the hard disk of the furniture design support apparatus, and vector data for rendering shapes other than rectangles is prepared on the hard disk.

FIG. 30 illustrates part (element) detail-drawing rendering definition data regarding a hanger pipe, and FIG. 31 illustrates a vector data table.

Data relating to rendering definition, surface position, vector rendering and reference number has been stored in the part (element) detail-drawing rendering definition data.

A detail drawing is rendered in regard to a surface position for which "1" has been stored as the rendering definition. In the part (element) detail-drawing rendering definition data regarding the hanger pipe shown in FIG. 30, the fact that three detail drawings for a top view (plan view), right view (right-side view) and front view are to be rendered is indicated.

In a case where "1" has been stored for vector rendering, the drawing regarding this surface position is illustrated (rendered) based upon vector data that has been stored in the vector data table shown in FIG. 31. In a case where "0" has been stored for vector rendering, a drawing having a rectangular shape is rendered using the part (element) detail-drawing rendering definition data and element definition data, as mentioned above.

In a case where "1" has been stored for vector rendering, vector data that has been stored in the vector data table correlated by a reference number is read out and render processing that is based upon the read vector data is executed.

Vector data for rendering a circle (inclusive of an oval), straight line and curve, etc., has been stored in the vector data table. The data is stored for every surface position of a part (element) that requires vector rendering. For example, in a case where a circle is rendered as the right-side view of a hanger pipe, vector data for rendering a circle is prepared. It should be noted that in regard to the diameter (radius) of a circle, a description is given to the effect that use is made of the diameter (radius) of a circle decided based upon element definition data (in the case of a hanger pipe, data representing thickness signifies the diameter of a circle).

Figure 32:
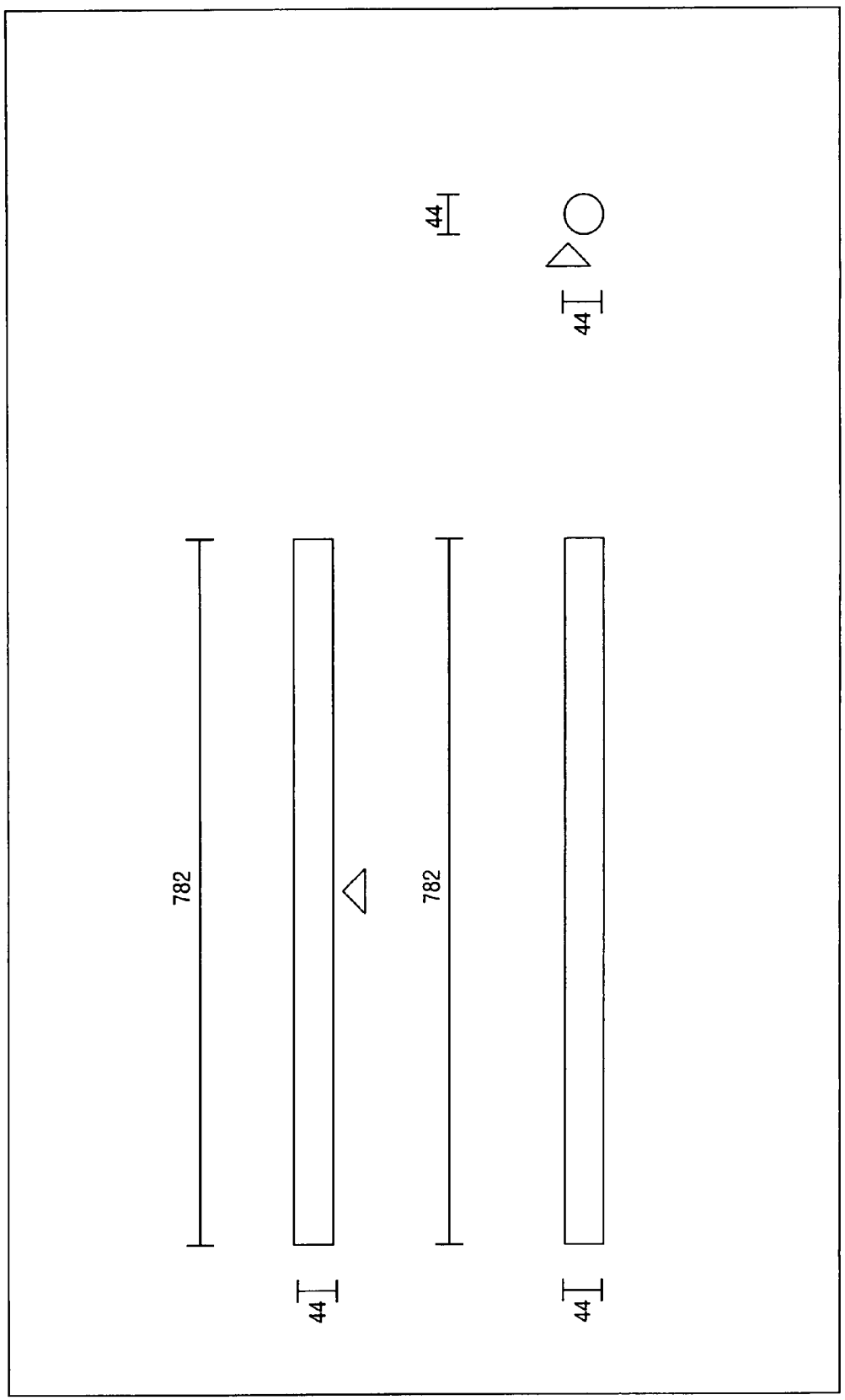
FIG. 32 illustrates another example of a detail drawing regarding a hanger pipe.

FIG. 32 illustrates a detail drawing regarding a hanger pipe using part (element) detail-drawing rendering definition data and vector data. By using vector data, the right-side view drawn in the form of a circle can be rendered on the detail drawing.

Figure 33:
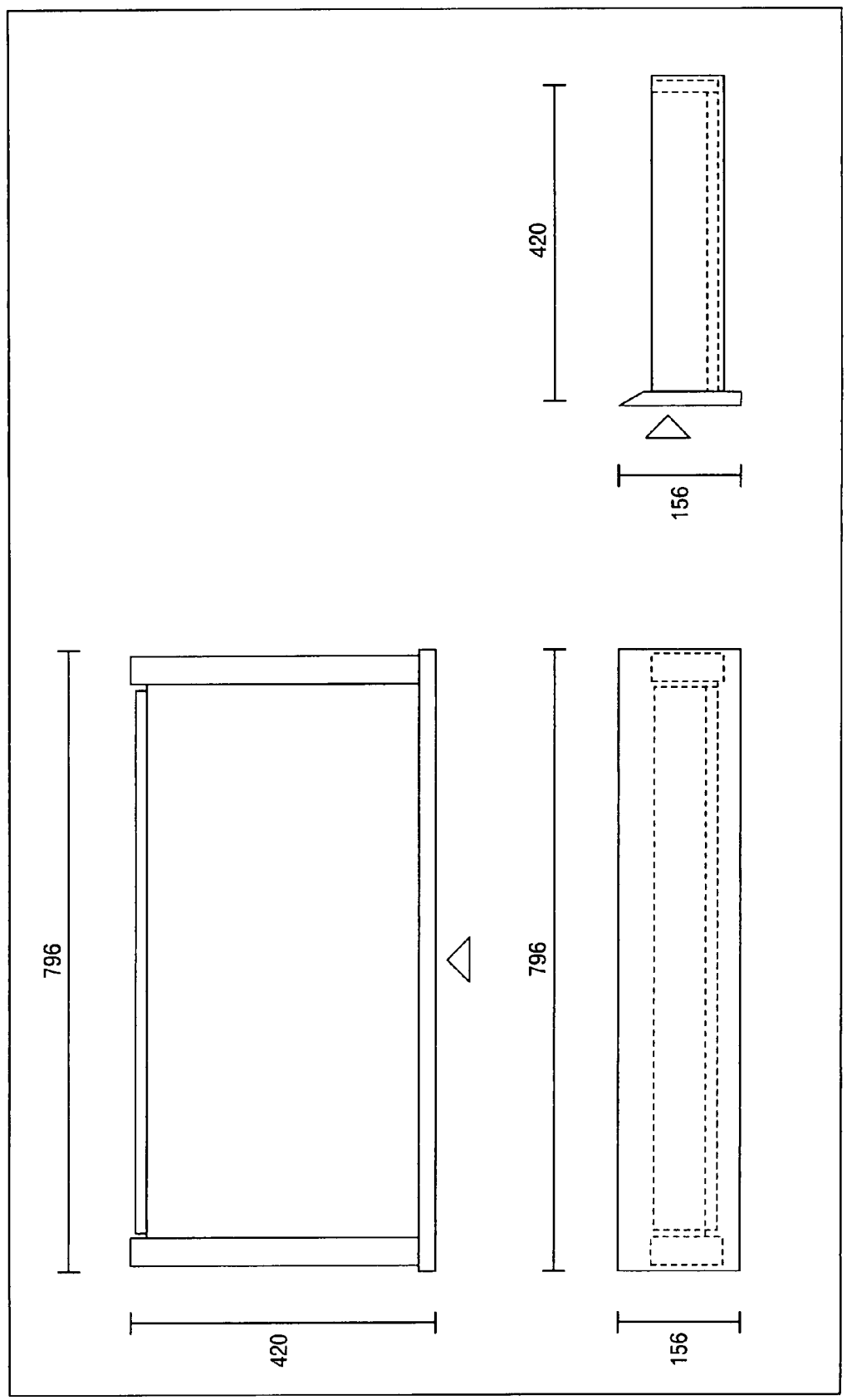
FIG. 33 illustrates a detail drawing of an outset drawer.
Figure 34:
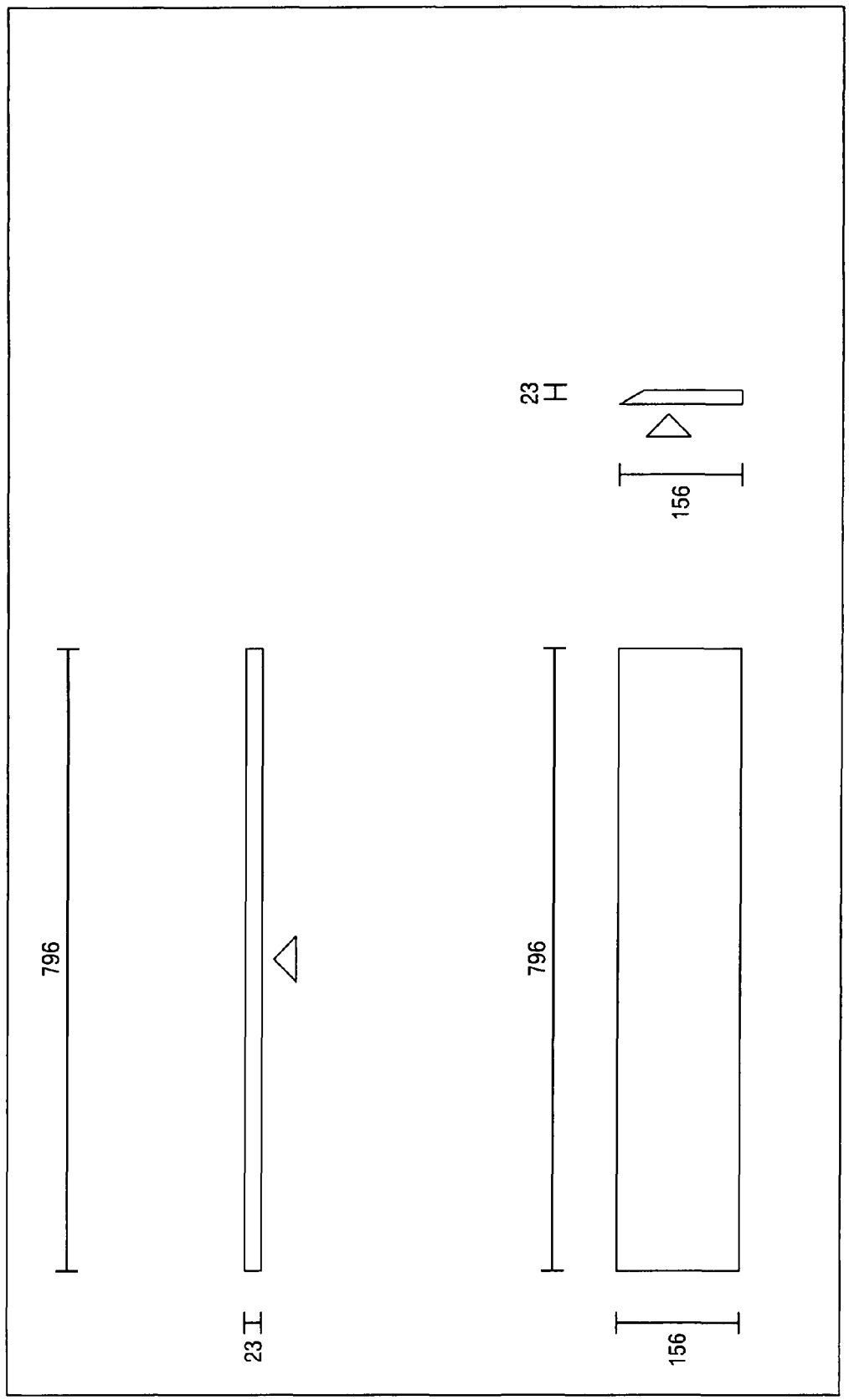
FIG. 34 illustrates a detail drawing of a front board that constitutes an outset drawer.

FIGS. 33 and 34 respectively illustrate a detail drawing regarding an outset drawer A and a detail drawing regarding a front board, which is one of a plurality of elements that constitute the outset drawer A shown in FIG. 33. As illustrated in FIGS. 33 and 34, even though the element is the front board of the outset drawer A which does not have the shape of a rectangular parallelepiped, the shape thereof can be rendered on a detail drawing accurately by using the part (element) detail-drawing rendering definition data and vector data.

According to the embodiment described above, the furniture design support apparatus is implemented by a single computer system. However, the furniture design support apparatus may be implemented by a plurality of computers connected via a network.

What is claimed is:

1. An article design support system for displaying on a display device images representing basic structural members of a plurality of types, each basic structural member constituting a frame of an article, and images representing parts of a plurality of types, each part being combined with the basic structural member, and combining a basic structural member selected from among the displayed structural members of the plurality of types and a part selected from among the displayed parts of the plurality of types, thereby displaying an article constructed by combining the basic structural member and the part, said system comprising:

first storage means for storing, with regard to each part of the plurality of types, three-dimensional part space data specifying relatively position and dimensions of a three-dimensional part space comprising the shape of a rectangular parallelepiped, using as a reference a three-dimensional cell space comprising the shape of a rectangular parallelepiped, defined by said basic structural member;

second storage means for storing, with regard to each part of the plurality of types, three-dimensional part data specifying relatively position and dimensions of the part using as a reference the three-dimensional part space defined by said three-dimensional part space data;

cell space/part space correlating means for correlating, on a one-to-one basis, a three-dimensional cell space defined by a selected basic structural member and a three-dimensional part space regarding a selected part; and display control means for displaying a part image in a three-dimensional cell space with which a three-dimensional part space has been correlated by said cell space/part space correlating means, the part image being displayed at a position decided by three-dimensional part space data, which concerns a selected part, stored in said first storage means, and three-dimensional part data, which concerns the selected part, stored in said second storage means, the part image having dimensions decided by said three-dimensional part space data and said three-dimensional part data.

2. The system according to claim 1, wherein said parts include a first part constituted by a single minimal structural element, and a second part formed by combining a plurality of minimal structural elements, and wherein said second storage means stores, with regard to each of the plurality of minimal structural elements concerning the second part, three-dimensional minimal structural element data specifying relative position and relative dimensions using as a reference the three-dimensional part space defined by said three-dimensional part space data.

3. The system according to claim 1, wherein said three-dimensional part space data defines the positions of a top surface, bottom surface, left surface, right surface, front surface and back surface of said three-dimensional part space by data representing distances from corresponding surfaces of said three-dimensional cell space.

4. The system according to claim 1, wherein said three-dimensional part space data defines at least one position among the positions of respective ones of the top surface, bottom surface, left surface, right surface, front surface and back surface of said three-dimensional part space by data representing distance from the opposite surface of said three-dimensional cell space, and defines positions of the remaining surfaces by data representing distances from the corresponding surfaces of said three-dimensional part space.

5. The system according to claim 1, wherein said three-dimensional part data defines the positions of a top surface, bottom surface, left surface, right surface, front surface and back surface of said part or of said minimal structural element by data representing distances from corresponding surfaces of said three-dimensional part space.

6. The system according to claim 1, wherein said three-dimensional part data defines the positions of a top surface, bottom surface, left surface, right surface, front surface and back surface of said part or of said minimal structural element by data representing distances from any five surfaces among the top surface, bottom surface, left surface, right surface, front surface and back surface of said three-dimensional part space, and data representing the thickness of the part or minimal structural element.

7. The system according to claim 1, further comprising third storage means for storing data specifying, on a per-surface basis with regard to each part of the plurality of types, whether the top surface, bottom surface, left surface, right surface, front surface and back surface of said three-dimensional cell space and respective corresponding surfaces of said three-dimensional part space are linked.

8. The system according to claim 1, further comprising fourth storage means for storing data specifying, on a per-surface basis with regard to each part of the plurality of types, whether the top surface, bottom surface, left surface, right surface, front surface and back surface of said three-dimensional part space and a respective corresponding surface of said part or a minimal structural element constituting said part are linked.

9. The system according to claim 1, further comprising cell space partitioning means for partitioning said three-dimensional cell space in a case where the size of the three-dimensional cell space with which the three-dimensional part space has been correlated by said cell space/part space correlating means is larger than that of the three-dimensional part space that has been correlated with this three-dimensional cell space.

10. The system according to claim 1, further comprising cell space partitioning means for partitioning said three-dimensional cell space in a case where said three-dimensional cell space has been enlarged in such a manner that the size of the three-dimensional cell space with which the three-dimensional part space has been correlated by said cell space/part space correlating means is larger than that of the three-dimensional part space that has been correlated with this three-dimensional cell space.

11. The system according to claim 1, further comprising:
detail drawing creating means for creating a detail drawing that includes dimensions regarding at least one of a basic structural member included in an article, a part included in the article and minimal structural elements constituting the part included in the article, based upon said three-dimensional cell space, said three-dimensional part space data and said three-dimensional part data; and
output means for outputting the detail drawing that includes the dimensions created by said detail drawing creating means.

12. The system according to claim 11, further comprising vector rendering data storage means storing vector rendering data,
wherein said detail drawing creating means creates a detail drawing regarding a previously defined surface in a previously defined basic structural member, part or minimal structural element, based upon vector rendering data that has been stored in said vector rendering data storage means.

13. The system according to claim 2, wherein said three-dimensional part data or said three-dimensional minimal structural element data defines the positions of a top surface, bottom surface, left surface, right surface, front surface and back surface of said part or of said minimal structural element by data representing distances from corresponding surfaces of said three-dimensional part space.

14. The system according to claim 2, wherein said three-dimensional part data or said three-dimensional minimal structural element data defines the positions of a top surface, bottom surface, left surface, right surface, front surface and back surface of said part or of said minimal structural element by data representing distances from any five surfaces among the top surface, bottom surface, left surface, right surface, front surface and back surface of said three-dimensional part space, and data representing a thickness of the part or minimal structural element.

15. The system according to claim 2, further comprising fourth storage means for storing data specifying, on a per-surface basis with regard to each part of the plurality of types, whether the top surface, bottom surface, left surface, right surface, front surface and back surface of said three-dimensional part space and a respective corresponding surface of said part or minimal structural element constituting said part are linked.

16. The system according to claim 2, further comprising:
detail drawing creating means for creating a detail drawing that includes dimensions regarding at least one of a basic structural member included in an article, a part included in the article and minimal structural elements constituting the part included in the article, based upon said three-dimensional cell space, said three-dimensional part space data and said three-dimensional part data; and
output means for outputting the detail drawing that includes the dimensions created by said detail drawing creating means.

17. The system according to claim 1, wherein the cell space/part space correlating means enlarges or reduces the relative dimensions of the three-dimensional part space regarding a selected part in relation to the dimensions of the three-dimensional cell space defined by a selected basic structural member.

18. A method of controlling an article design support system for displaying on a display device images representing basic structural members of a plurality of types, each basic structural member constituting a frame of an article, and images representing parts of a plurality of types, each part being combined with the basic structural member, and combining a basic structural member selected from among the displayed structural members of the plurality of types and a part selected from among the displayed parts of the plurality of types, thereby displaying an article constructed by combining the basic structural member and the part, the method comprising:
accepting from input means and storing in first storage means, with regard to each part of the plurality of types, three-dimensional part space data specifying relatively position and dimensions of a three-dimensional part space comprising the shape of a rectangular parallelepiped, using as a reference a three-dimensional cell space comprising the shape of a rectangular parallelepiped, defined by said basic structural member;
accepting from said input means and storing in second storage means, with regard to each part of the plurality of types, three-dimensional part data specifying relatively position and dimensions of the part using as a reference the three-dimensional part space defined by said three-dimensional part space data;
correlating, by cell space/part space correlating means, on a one-to-one basis, a three-dimensional cell space defined by a selected basic structural member and a three-dimensional part space regarding a selected part; and
displaying, by display control means, a part image in said three-dimensional cell space with which said three-dimensional part space has been correlated, the part image being displayed at a position decided by three-dimensional part space data, which concerns a selected part, stored in said first storage means, and three-dimensional part data, which concerns the selected part, stored in said second storage means, the part image having dimensions decided by said three-dimensional part space data and said three-dimensional part data.

19. A programmable storage medium tangibly embodying a program of machine-readable instructions executable by a computer to perform a method for defining data used in an article design support system for displaying on a display device images representing basic structural members of a plurality of types, each basic structural member constituting a frame of an article, and images representing parts of a plurality of types, each part being combined with the basic structural member, and combining a basic structural member selected from among the displayed structural members of the plurality of types and a part selected from among the displayed parts of the plurality of types, thereby displaying an article constructed by combining the basic structural member and the part, said method comprising:

accepting, with regard to each part of the plurality of types, an input of three-dimensional part space data specifying relatively position and dimensions of a three-dimensional part space comprising the shape of a rectangular parallelepiped, using as a reference a three-dimensional cell space comprising the shape of a rectangular parallelepiped, defined by said basic structural member, and storing the accepted three-dimensional part space data in first storage means;

accepting, with regard to each part of the plurality of types, an input of three-dimensional part data specifying relatively position and dimensions of the part using as a reference the three-dimensional part space defined by said three-dimensional part space data, and storing the accepted three-dimensional part data in second storage means.

20. The programmable storage medium according to claim 19, wherein said parts include a first part constituted by a single minimal structural element, and a second part formed by combining a plurality of minimal structural elements;

said program causing a computer to execute processing for accepting, with regard to each of the plurality of minimal structural elements concerning said second part, an input of three-dimensional minimal structural element data specifying relative position and relative dimensions using as a reference the three-dimensional part space defined by said three-dimensional part space data, and storing the three-dimensional minimal structural element data in said second storage means.

* * * * *